(12) United States Patent
Kuhara et al.

(10) Patent No.: US 7,290,942 B2
(45) Date of Patent: Nov. 6, 2007

(54) OPTICAL TRANSCEIVER MODULES

(75) Inventors: Yoshiki Kuhara, Osaka (JP); Akira Yamaguchi, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 673 days.

(21) Appl. No.: 10/757,867

(22) Filed: Jan. 14, 2004

(65) Prior Publication Data

US 2004/0146304 A1 Jul. 29, 2004

(30) Foreign Application Priority Data

Jan. 24, 2003 (JP) ............................ P2003-016433

(51) Int. Cl.
*G02B 6/36* (2006.01)
(52) U.S. Cl. ............................ 385/88; 385/53; 385/92; 385/93; 385/94
(58) Field of Classification Search ................ 385/53, 385/88–92
See application file for complete search history.

(56) References Cited

U.S. PATENT DOCUMENTS 5,566,265 A * 10/1996 Spaeth et al. ................. 385/93
5,841,562 A  11/1998 Rangwala et al.
6,188,495 B1 * 2/2001 Inoue et al. ................ 398/139

FOREIGN PATENT DOCUMENTS

| EP | 0644669 A1 | 3/1995 |
|---|---|---|
| JP | 10-093133 | 4/1998 |
| JP | 10-111439 | 4/1998 |
| JP | 10-153720 | 6/1998 |
| JP | 10-285122 | 10/1998 |
| JP | 11-054788 | 2/1999 |
| JP | 11-068129 | 3/1999 |
| JP | 11-068164 | 3/1999 |
| JP | 11-218651 | 8/1999 |
| JP | 2000-137151 | 5/2000 |
| JP | 2001-215350 | 8/2001 |

* cited by examiner

*Primary Examiner*—Jennifer Doan
(74) *Attorney, Agent, or Firm*—Fish & Richardson P.C.

(57) ABSTRACT

An optical transceiver module is comprised of a mount substrate, a transmitting semiconductor laser, a receiving photodiode, a communicating hole, and a first filter. The mount substrate is provided so as to intersect with a predetermined axis X and has first and second principal surfaces facing each other. The transmitting semiconductor laser is mounted on the first principal surface and is configured to emit light of a first wavelength. The receiving photodiode is mounted on the predetermined axis X and on the second principal surface and is configured to receiving light of a second wavelength. The communicating hole is provided in a region of the mount substrate where the receiving photodiode is mounted, and makes the first and second principal surfaces communicate with each other.

32 Claims, 19 Drawing Sheets

OPTICAL TRANSCEIVER MODULES

BACKGROUND OF THE INVENTION

1. Field of the Invention

The present invention relates to an optical transceiver module used in optical fiber communication and, particularly, to an optical transceiver module suitably applicable to single-fiber bidirectional communication.

2. Related Background Art

A conventional optical transceiver module suitably applicable to single-fiber bidirectional communication is, for example, the one disclosed in Document 1 (U.S. Pat. No. 5,841,562). This optical transceiver module is provided with a semiconductor laser and a photodiode. These semiconductor laser and photodiode are separately housed in their respective metal packages to form an emitter module and a receiver module, respectively. Then these emitter module and receiver module are assembled together with a ferrule having an optical fiber fixed therein. In this optical transceiver module, the optical fiber fixed in the ferrule has a slant surface obliquely polished and provided with reflecting and non-reflecting coatings, and this slant surface separates transmitting light from the semiconductor laser and receiving light into the photodiode from each other.

SUMMARY OF THE INVENTION

The Inventors conducted research on the above prior art and found the following problem. Namely, since the above-described conventional optical transceiver module was constructed in the structure wherein the semiconductor laser and photodiode were separately housed in their respective packages and wherein these were assembled in the ferrule, there was the problem that the structure required the large number of parts and some time and labor for the assembly against the demand for cost reduction and had a limitation to compactification of the entire module.

The present invention has been accomplished in order to solve the above problem and an object of the present invention is to provide a compact optical transceiver module capable of achieving reduction of cost.

An optical transceiver module according to the present invention is an optical transceiver module for emitting transmitting light along a predetermined axis and receiving receiving light having propagated along the predetermined axis. The optical transceiver module comprises: (1) a mount substrate disposed so as to intersect with the predetermined axis and having first and second principal surfaces facing each other; (2) a transmitting semiconductor laser mounted on the first principal surface and configured to emit light of a first wavelength; (3) a receiving photodiode provided on the predetermined axis and on the second principal surface side and configured to receive light of a second wavelength; (4) a communicating hole provided in a region of the mount substrate intersecting with the predetermined axis, and letting the first and second principal surfaces communicate with each other; and (5) a first filter disposed on the predetermined axis and in a region intersecting with the first principal surface, and configured to reflect the light of the first wavelength and transmit the light of the second wavelength. The light of the first wavelength having been emitted from the transmitting semiconductor laser and propagating along the first principal surface is reflected by the first filter and emitted as the transmitting light along the predetermined axis, and the light of the second wavelength as the receiving light having propagated along the predetermined axis is transmitted by the first filter and travels through the communicating hole to be received by the receiving photodiode.

As an aspect, an optical transceiver module according to the present invention comprises (1) a mount substrate disposed so as to intersect with the predetermined axis and having first and second principal surfaces facing each other; (2) a transmitting semiconductor laser mounted on the first principal surface and configured to emit light of a first wavelength; (3) a receiving photodiode mounted on the predetermined axis and on the second principal surface and configured to receive light of a second wavelength; (4) a communicating hole provided in a region of the mount substrate where the receiving photodiode is mounted, and letting the first and second principal surfaces communicate with each other; and (5) a first filter disposed on the predetermined axis and in a region intersecting with the first principal surface, and configured to reflect the light of the first wavelength and transmit the light of the second wavelength. The light of the first wavelength having been emitted from the transmitting semiconductor laser and propagating along the first principal surface is reflected by the first filter and emitted as the transmitting light along the predetermined axis, and the light of the second wavelength as the receiving light having propagated along the predetermined axis is transmitted by the first filter and travels through the communicating hole to be received by the receiving photodiode.

Since in this optical transceiver module the transmitting semiconductor laser and the receiving photodiode are mounted on the same mount substrate, this configuration decreases the number of parts and obviates the need for time and labor for assembly so as to reduce the cost and achieve compactification of the entire module, as compared with the conventional structure wherein they are housed in the separate packages and these are assembled together with the ferrule.

In a potential configuration, the optical transceiver module comprises a monitoring photodiode mounted on the first principal surface of the mount substrate so as to interpose the transmitting semiconductor laser between the first filter and the monitoring photodiode, and configured to receive backward light from the transmitting semiconductor laser. In another potential configuration, the optical transceiver module comprises a monitoring photodiode mounted on the first principal surface of the mount substrate so as to interpose the first filter between the transmitting semiconductor laser and the monitoring photodiode, and configured to receive light emitted from the transmitting semiconductor laser and transmitted by the first filter. In these configurations, the monitoring photodiode monitors the backward light or the light transmitted by the first filter, whereby it becomes feasible to suitably control the transmitting light emitted from the transmitting semiconductor laser.

The receiving photodiode can have a backside-illuminated type structure. This configuration is favorable, because the backside can be directly mounted on the second principal surface of the mount substrate.

A second filter for shutting out the light of the first wavelength may be provided between the receiving photodiode and the second principal surface of the mount substrate. In this configuration, the second filter shuts out the light from the transmitting semiconductor laser having propagated through the communicating hole from the first principal surface side, so as to decrease crosstalk.

The receiving photodiode can have a filter layer for absorbing the light of the first wavelength. In this configuration, the filter layer of the receiving photodiode absorbs the light from the transmitting semiconductor laser having propagated through the communicating hole from the first principal surface side, so as to decrease crosstalk.

The optical transceiver module can comprise an amplifier mounted on the second principal surface and configured to amplify an electric signal from the receiving photodiode. In this configuration, the amplifier amplifies a weak electric signal from the receiving photodiode, so as to enhance the resistance to noise.

In a potential configuration, the mount substrate has: a first substrate including the first principal surface and a third principal surface facing the first principal surface; and a second substrate including the second principal surface and a fourth principal surface facing the second principal surface, and the mount substrate is formed by assembling the first and second substrates in a state in which the third and fourth principal surfaces face each other. Since this configuration permits the first substrate loaded with the transmitting semiconductor laser and the second substrate loaded with the receiving photodiode, to be separately fabricated and to be separately inspected, assembly and integration of only nondefectives can decrease defect loss and increase the yield.

The optical transceiver module can comprise a lens for condensing the transmitting light and the receiving light, which is located on the predetermined axis so that the first filter is interposed between the receiving photodiode and the lens. This configuration achieves satisfactory optical coupling with an external optical fiber.

The optical transceiver module can comprise a casing for housing the mount substrate. This configuration seals in the devices such as the transmitting semiconductor laser and the receiving photodiode mounted on the mount substrate, so as to be able to secure stable operation over a long period of time.

In a potential configuration, the casing comprises: a first casing portion located on the first principal surface side; and a second casing portion located on the second principal surface side, and the mount substrate is housed in the casing in a state in which the mount substrate is sandwiched between the first casing portion and the second casing portion. This configuration facilitates a work of placing the mount substrate into the casing.

In a potential configuration, the mount substrate is covered by a resin body. This configuration seals in the devices such as the transmitting semiconductor laser and the receiving photodiode mounted on the mount substrate, so as to be able to secure stable operation over a long period of time.

In another potential configuration, the mount substrate is covered by a resin body and the lens is buried in the resin body. This configuration enables fixing of the lens without use of any special fixing means.

The optical transceiver module can comprise a fit portion provided on the first principal surface side of the mount substrate and configured to hold a ferrule with an optical fiber therein in a fit state. This configuration permits the ferrule with the optical fiber therein to be fitted and held in the fit portion, so as to achieve optical coupling with the optical fiber.

As another aspect, an optical transceiver module according to the present invention comprises (1) a first mount substrate disposed so as to intersect with the predetermined axis and having first and second principal surfaces facing each other; (2) a transmitting semiconductor laser mounted on the first principal surface and configured to emit light of a first wavelength; (3) a communicating hole provided in a region where the predetermined axis intersects with the first mount substrate, and letting the first and second principal surfaces communicate with each other; (4) a second mount substrate disposed so as to intersect with the predetermined axis and having third and fourth principal surfaces facing each other; (5) a receiving photodiode mounted on the predetermined axis and on the third principal surface and configured to receive light of a second wavelength; and (6) a first filter disposed on the predetermined axis and in a region intersecting with the first principal surface, and configured to reflect the light of the first wavelength and transmit the light of the second wavelength. The first mount substrate and the second mount substrate are assembled so that the second principal surface faces the third principal surface; the light of the first wavelength having been emitted from the transmitting semiconductor laser and propagating along the first principal surface is reflected by the first filter and emitted as the transmitting light along the predetermined axis; and the light of the second wavelength as the receiving light having propagated along the predetermined axis is transmitted by the first filter and travels through the communicating hole to be received by the receiving photodiode.

In this optical transceiver module, the transmitting semiconductor laser is mounted on the first mount substrate, the receiving photodiode is mounted on the second mount substrate, and these are assembled into one. Therefore, this configuration decreases the number of parts and obviates the need for time and labor for assembly so as to reduce the cost and achieve compactification of the entire module, as compared with the conventional structure wherein they are housed in the separate packages and these packages are assembled in the ferrule. Since the configuration permits the first substrate loaded with the transmitting semiconductor laser and the second substrate loaded with the receiving photodiode, to be separately fabricated and to be separately inspected, assembly and integration of only nondefectives can decrease defect loss and increase the yield.

In a potential configuration, the optical transceiver module comprises a monitoring photodiode mounted on the first principal surface of the first mount substrate so as to interpose the transmitting semiconductor laser between the first filter and the monitoring photodiode, and configured to receive backward light from the transmitting semiconductor laser. In another potential configuration, the module comprises a monitoring photodiode mounted on the first principal surface of the first mount substrate so as to interpose the first filter between the transmitting semiconductor laser and the monitoring photodiode, and configured to receive light emitted from the transmitting semiconductor laser and transmitted by the first filter. In these configurations, the monitoring photodiode monitors the backward light or the light transmitted by the first filter, whereby it becomes feasible to suitably control the transmitting light emitted from the transmitting semiconductor laser.

In a potential configuration, the receiving photodiode has a frontside-illuminated type structure. This configuration is favorable, because the backside can be directly mounted on the third principal surface of the second mount substrate.

A second filter for shutting out the light of the first wavelength may be provided on the second principal surface in the region where the communicating hole in the first mount substrate is provided. In this configuration, the second filter shuts out the light from the transmitting semiconductor laser having propagated through the communicating hole from the first principal surface side, so as to decrease crosstalk.

In a potential configuration, the optical transceiver module comprises an amplifier mounted on the third principal surface of the second mount substrate and configured to amplify an electric signal from the receiving photodiode. In this configuration, the amplifier amplifies a weak electric signal from the receiving photodiode, so as to enhance the resistance to noise.

In a potential configuration, the optical transceiver module comprises a lens for condensing the transmitting light and the receiving light, which is located on the predetermined axis so that the first filter is interposed between the receiving photodiode and the lens. This configuration achieves satisfactory optical coupling with an external optical fiber.

In a potential configuration, the optical transceiver module comprises a casing located on the first principal surface side of the first mount substrate, wherein the first mount substrate is sandwiched between the casing and the second mount substrate. This configuration seals in the devices such as the transmitting semiconductor laser mounted on the first mount substrate and the receiving photodiode mounted on the second mount substrate, so as to be able to secure stable operation over a long period of time.

In a potential configuration, a resin body is placed on the first principal surface of the first mount substrate. This configuration seals in the transmitting semiconductor laser and others mounted on the first mount substrate, so as to be able to secure stable operation over a long period of time.

In another potential configuration, a resin body is placed on the first principal surface of the first mount substrate and the lens is buried in the resin body. This configuration enables fixing of the lens without use of any special fixing means.

In a potential configuration, the optical transceiver module comprises a fit portion provided on the first principal surface side of the first mount substrate and configured to hold a ferrule with an optical fiber therein in a fit state. This configuration permits the ferrule with the optical fiber therein to be fitted and held in the fit portion, so as to achieve optical coupling with the optical fiber.

The present invention can be further fully understood by referring to the following detailed description and accompanying drawings. It is noted that these are presented simply for the illustrative purpose but not for the purpose of limiting the present invention.

DETAILED DESCRIPTION OF THE PREFERRED EMBODIMENTS

Embodiments of the present invention will be described below with reference to the accompanying drawings. The same elements will be denoted by the same reference symbols throughout the description of the drawings, without redundant description thereof.

Figure 1:
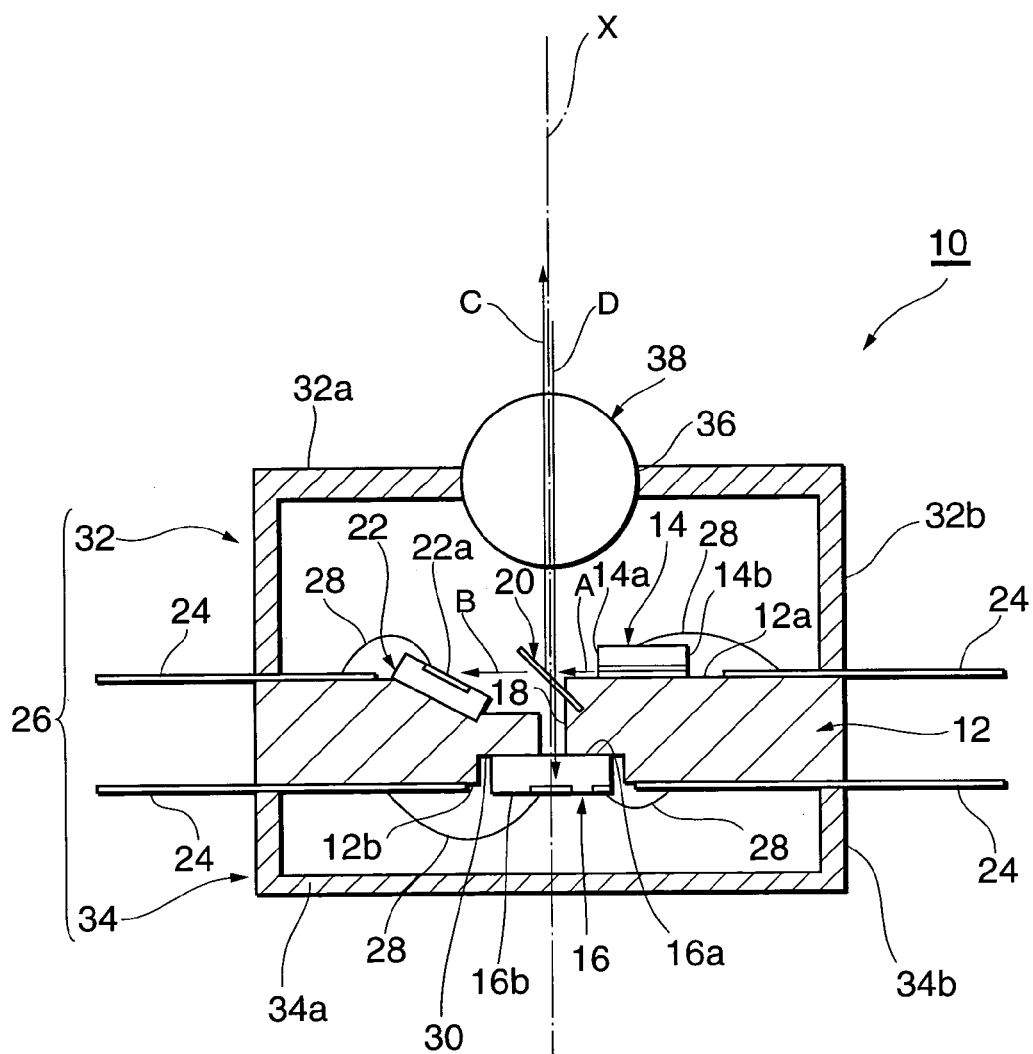
FIG. 1 is a vertical sectional view showing a configuration of the optical transceiver module according to the first embodiment.
Figure 2:
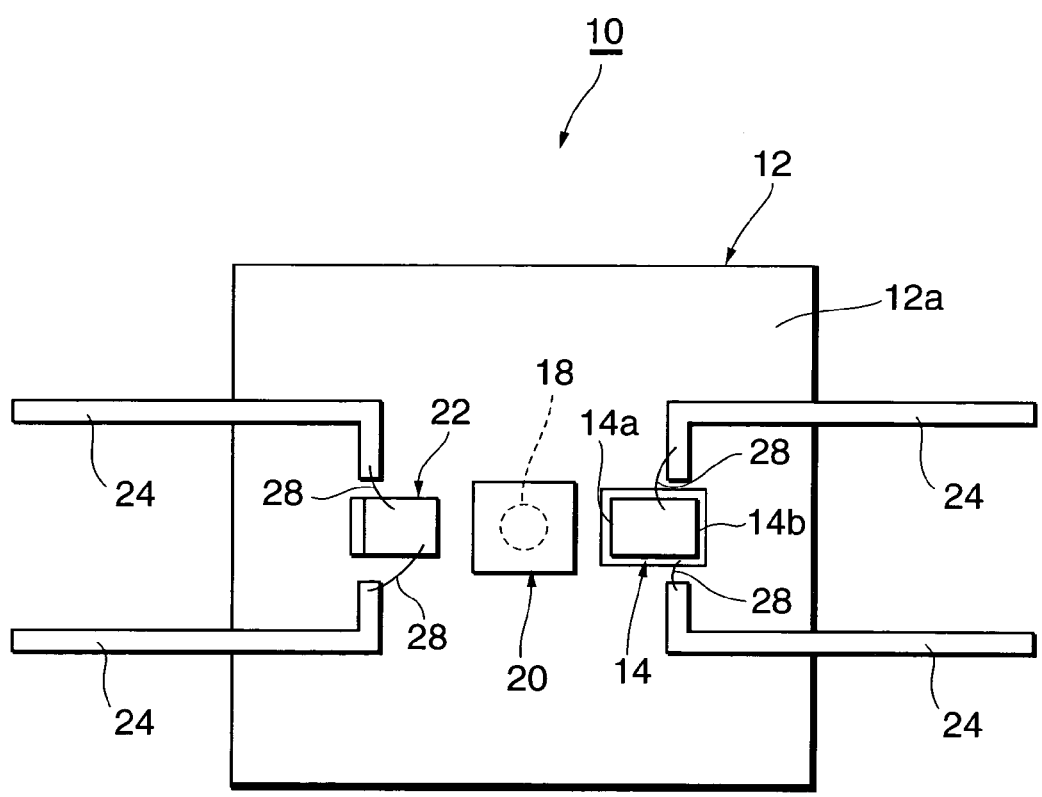
FIG. 2 is a plan view showing the configuration of the optical transceiver module of the first embodiment in a state in which an upper casing is removed.

FIG. 1 is a vertical sectional view showing the configuration of optical transceiver module 10 according to the first embodiment. FIG. 2 is a plan view showing the configuration of optical transceiver module 10 in a state in which upper casing 32 is removed. As shown in FIGS. 1 and 2, the optical transceiver module 10 is a module suitably applicable to single-fiber bidirectional communication, which is configured to emit transmitting light along the optical axis X (predetermined axis) and receive receiving light having propagated along the optical axis X. In the present embodiment, the transmitting light and the receiving light is light of different wavelengths; for example, let us assume that the transmitting light is light of the wavelength of 1.3 µm and the receiving light is light of the wavelength of 1.55 µm.

This optical transceiver module 10, as shown in FIGS. 1 and 2, is provided with mount substrate 12 having upper surface (first principal surface) 12a and lower surface (second principal surface) 12b facing each other. This mount substrate 12 has a rectangular outer shape and is located so as to be perpendicular to the optical axis X. The mount substrate 12 is made, for example, of a resin material such as a liquid crystal polymer or a polyimide, and has the light blocking property.

Transmitting semiconductor laser 14 is mounted in the vicinity of a region of upper surface 12a of mount substrate 12 intersecting with the optical axis X. This transmitting semiconductor laser 14 is made, for example, of InGaAsP and emits light of first wavelength $\lambda_1$ (e.g., 1.3 μm). In this transmitting semiconductor laser 14, front face 14a and back face 14b are coated with a reflecting film to constitute a resonator, and light emitted from front face 14a propagates in a direction along the upper surface 12a of the mount substrate 12.

Receiving photodiode 16 for receiving light of second wavelength $\lambda_2$ (e.g., 1.55 μm) is mounted in a region of lower surface 12b of mount substrate 12 intersecting with the optical axis X. This receiving photodiode 16 preferably has a backside-illuminated type structure, as shown in FIG. 1. This configuration permits back face 16a of the photodiode to be directly mounted on the lower surface 12b of mount substrate 12. The receiving photodiode 16 is made, for example, of InGaAs/InP and can receive light of wavelengths of 1.0 μm-1.6 μm with high sensitivity. The receiving photodiode 16 is provided with unrepresented P-electrode and N-electrode on top face 16b opposing the back face 16a. In general, in the case of the backside-illuminated type photodiodes, the P-electrode of disk shape can be formed in a small area, and thus the diameter of the light receiving area can be as small as about 50 μm-100 μm, for example. Therefore, the capacitance of the pn junction can be small, which enables achievement of higher speed and higher sensitivity. Although in the present embodiment the two P- and N-electrodes are provided on the top face 16b, the arrangement of the electrodes does not have to be limited to this example; for example, the N-electrode may be provided on the back face 16a.

Communicating hole 18 for letting upper surface 12a and lower surface 12b communicate with each other is provided in a region of mount substrate 12 where the receiving photodiode 16 is mounted. This configuration permits the receiving photodiode 16 to receive the receiving light having propagated from upper surface 12a of mount substrate 12, through the communicating hole 18.

Filter (first filter) 20 for reflecting the light of the first wavelength $\lambda_1$ and transmitting the light of the second wavelength $\lambda_2$ is provided on the optical axis X and in a region intersecting with the upper surface 12a of the mount substrate 12. This filter 20 is comprised, for example, of a dielectric multilayer filter and is disposed at a predetermined angle (45°) relative to the optical axis X. The fixation of this filter 20 is implemented, for example, by fitting one end thereof into a groove formed in the mount substrate 12.

Monitoring photodiode 22 is mounted on upper surface 12a of mount substrate 12 and on the opposite side to the transmitting semiconductor laser 14 with filter 20 in between. This monitoring photodiode 22 has a frontside-illuminated type structure and is obliquely mounted on the upper surface 12a of mount substrate 12 so that light receiving surface 22a thereof faces the filter 20. This monitoring photodiode 22 receives merely several % of light, emitted from front face 14a of transmitting semiconductor laser 14, which is transmitted by filter 20. The emission state of the laser can be suitably controlled by letting the monitoring photodiode 22 monitor the emission state of the transmitting semiconductor laser 14 and performing feedback control based thereon. Since the monitoring photodiode 22 of the frontside-illuminated type structure is most commonly available, inexpensive, and easy to mount, it is feasible to increase working efficiency and keep the cost down.

Lead pins 24 for exchange of electric signals with the outside are mounted on each of the upper and lower surfaces 12a, 12b of mount substrate 12, and these lead pins 24 are led out through the side wall of casing 26 to the outside. Each lead pin 24 is electrically connected through bonding wire 28 to each device such as transmitting semiconductor laser 14, receiving photodiode 16, monitoring photodiode 22, and the like. A preferred configuration herein is, as shown in FIG. 1, that recess 30 is provided in the region of lower surface 12b of mount substrate 12 where receiving photodiode 16 is mounted and that the receiving photodiode 16 is mounted in this recess 30. This configuration decreases the level difference between the top face 16b of receiving photodiode 16 and the lower surface 12b of mount substrate 12, so as to decrease the lengths of bonding wires 28 and thereby enable achievement of much higher speed.

The optical transceiver module 10 of the present embodiment is also provided with casing 26 for housing the mount substrate 12. This casing 26 is made of a metal material such as iron, copper, an iron-cobalt-nickel alloy, stainless steel, or the like, or a resin material such as an epoxy resin, a liquid crystal polymer, or the like. This casing 26 has upper casing (first casing portion) 32 placed on the upper surface 12a side of mount substrate 12, and lower casing (second casing portion) 34 placed on the lower surface 12b side of mount substrate 12. Each of these upper and lower casings 32, 34 includes bottom wall part 32a, 34a extending in parallel with the mount substrate 12 and having almost the same area as the mount substrate 12, and side wall part 32b, 34b provided in the marginal region of bottom wall part 32a, 34a, and a vertical cross section thereof is of U-shape. Accordingly, the mount substrate 12 is housed while being sandwiched between side wall part 32b of upper casing 32 provided on the upper surface 12a side and side wall part 34b of lower casing 34 provided on the lower surface 12b side. Circular hole 36 is provided in a region of bottom wall part 32a of upper casing 32 intersecting with the optical axis X, and ball lens 38 is fitted and fixed in this hole 36. This ball lens 38 is provided for condensing the transmitting light and the receiving light and this increases coupling efficiency with an external optical fiber not shown.

The operation of above-described optical transceiver module 10 of the present embodiment will be described below.

An electric signal is supplied through lead pin 24 to activate transmitting semiconductor laser 14, whereupon the laser 14 emits the light of the first wavelength $\lambda_1$ from front face 14a. This light propagates along the upper surface 12a of mount substrate 12 to reach filter 20 (cf. arrow A). Part of the light, several %, is transmitted by filter 20 and received by monitoring photodiode 22 (cf. arrow B). The emission state of transmitting semiconductor laser 14 is monitored on the basis of information from monitoring photodiode 22 and feedback control is carried out based thereon. This can suitably control the emission state of transmitting semiconductor laser 14.

Most of the light having been emitted from transmitting semiconductor laser 14 and having reached the filter 20 is reflected by this filter 20. The traveling direction of the light is changed by approximately 90° and the light propagates as the transmitting light along the optical axis X (cf. arrow C). Then the light is condensed by ball lens 38 and is emitted toward the external optical fiber not shown.

On the other hand, the receiving light of the second wavelength $\lambda_2$ having propagated in the unrepresented external optical fiber and having propagated along the optical axis X is condensed by ball lens 38. Then the light is transmitted by filter 20, travels through the communicating hole 18 of mount substrate 12, and then is received by receiving photodiode 16 (cf. arrow D). Then an electric signal generated by photoelectric conversion is extracted through lead pin 24 to the outside.

An example of fabrication of optical transceiver module 10 of the present embodiment will be described below.

Figure 3:
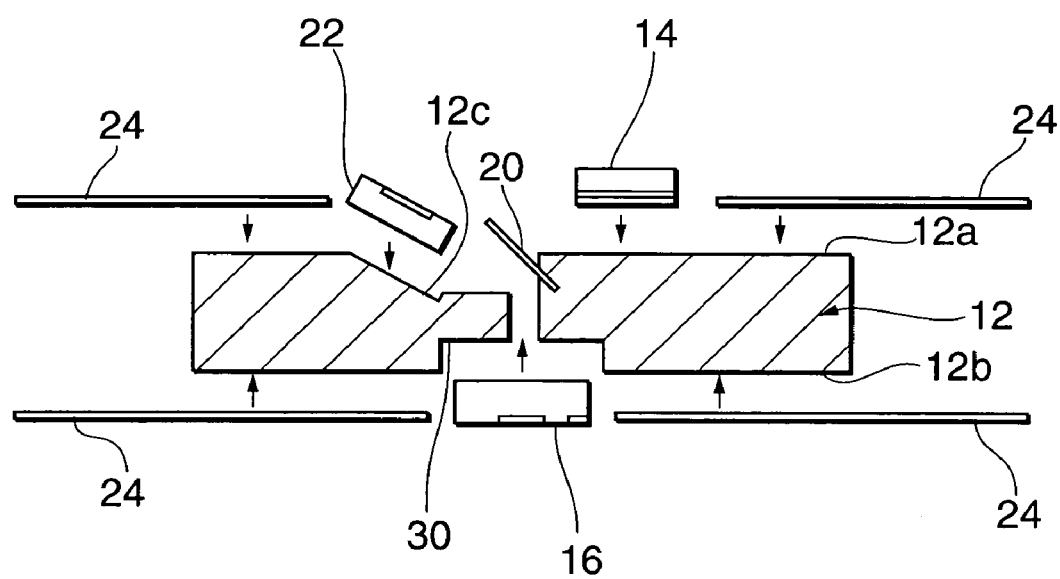
FIG. 3 is an illustration for explaining how to fabricate the optical transceiver module according to the first embodiment.
Figure 4:
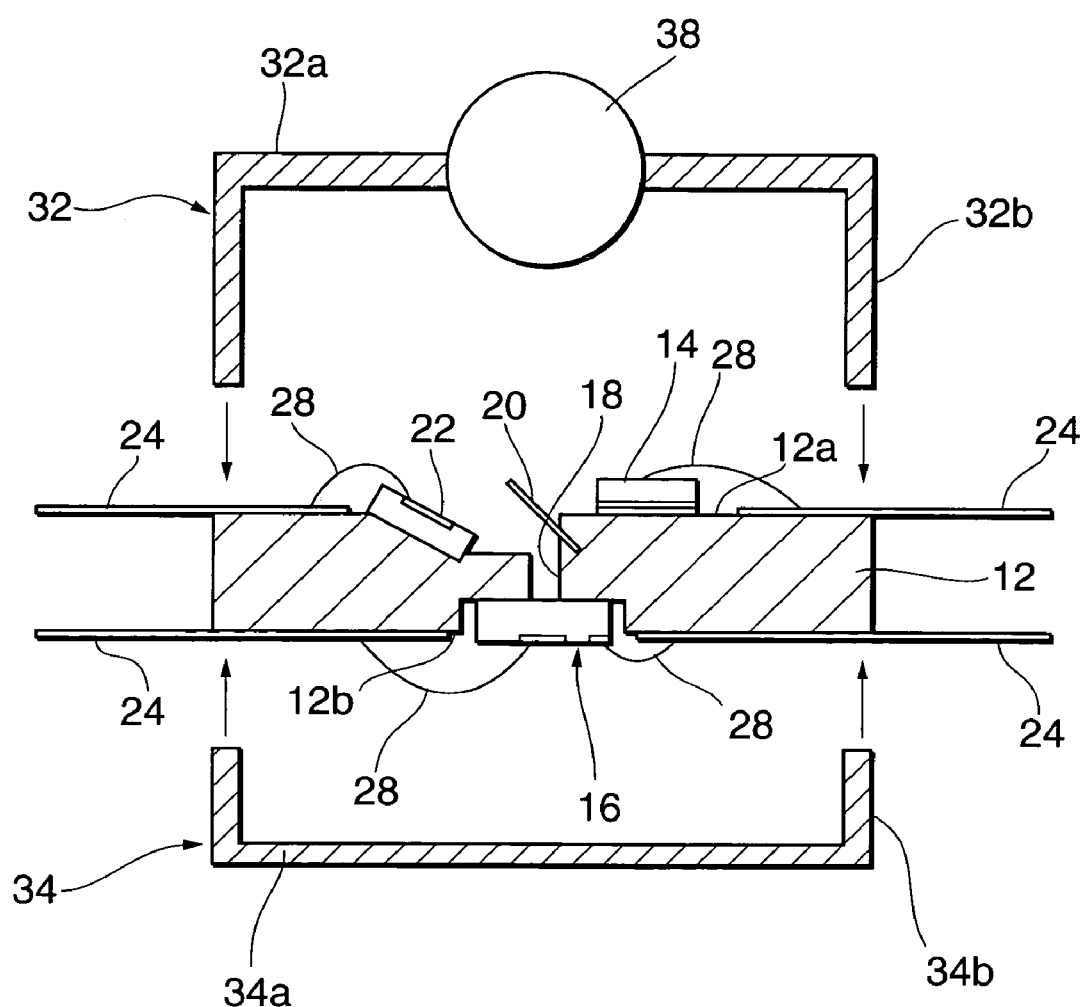
FIG. 4 is an illustration for explaining how to fabricate the optical transceiver module according to the first embodiment.

FIG. 3 and FIG. 4 are illustrations for explaining how to fabricate the optical transceiver module 10 of the present embodiment. As shown in FIG. 3, mount substrate 12 is first prepared. This mount substrate 12 is provided with communicating hole 18 and further with recess 30 for mounting of receiving photodiode 16 and slant face 12c for oblique mounting of monitoring photodiode 22.

Then the transmitting semiconductor laser 14, monitoring photodiode 22, receiving photodiode 16, and lead pins 24 are simultaneously mounted on the upper and lower surfaces 12a, 12b of mount substrate 12 by reflow soldering or the like. FIG. 3 illustrates a case where filter 20 is preliminarily fixed to mount substrate 12, but the filter 20 may be fixed after the foregoing process.

Then bonding wires 28 are fixed between each lead pin 24 and each device such as transmitting semiconductor laser 14, monitoring photodiode 22, and receiving photodiode 16.

Then, as shown in FIG. 4, upper casing 32 with ball lens 38 is placed on the upper surface 12a side of mount substrate 12, and lower casing 34 on the lower surface 12b side of mount substrate 12 so that the mount substrate 12 is sandwiched between the upper casing 32 and lower casing 34 through side wall parts 32b, 34b. The optical transceiver module 10 is fabricated in this way.

The action and effect of optical transceiver module 10 of the present embodiment will be described below.

In the optical transceiver module 10 of the present embodiment, the transmitting semiconductor laser 14 and receiving photodiode 16 are mounted on the same mount substrate 12, and this structure decreases the number of parts and obviates the need for time and labor for assembly, so as to decrease the cost and achieve compactification of the entire module, as compared with the conventional structure wherein they are housed in the separate packages and these packages are assembled together with the ferrule.

In the optical transceiver module 10 of the present embodiment, the transmitting semiconductor laser 14 is mounted on upper surface 12a of mount substrate 12 while the receiving photodiode 16 is on the lower surface 12b, whereby the transmission side and the reception side are separated from each other by the mount substrate 12, so as to be able to decrease crosstalk.

In the optical transceiver module 10 of the present embodiment, the mount substrate 12 is located so as to be perpendicular to the optical axis X and the filter 20 reflects the light from transmitting semiconductor laser 14; therefore, it is feasible to effectively use the region of the upper surface 12a of mount substrate 12 on the opposite side to the semiconductor laser 14 with respect to filter 20. In the present embodiment, for example, the region of upper surface 12a of mount substrate 12 is effectively used by mounting the monitoring photodiode 22 on the opposite side to transmitting semiconductor laser 14 with filter 20 in between.

By mounting the monitoring photodiode 22 in this way and monitoring the light having been transmitted by filter 20, it becomes feasible to suitably control the transmitting light emitted from the transmitting semiconductor laser 14. The use of the monitoring photodiode 22 of the frontside-illuminated type structure enables the cost to be kept down in terms of the working efficiency as well as the price thereof.

In the optical transceiver module 10 of the present embodiment, since the receiving photodiode 16 has the backside-illuminated type structure, the back face 16a can be directly mounted on the lower surface 12b of mount substrate 12, so as to be able to achieve facilitation of mounting. In addition, since the diameter of the light receiving area can be as small as, for example, about 50 μm-100 μm, the capacitance of the pn junction can be small, so as to enable achievement of higher speed and higher sensitivity.

In the optical transceiver module 10 of the present embodiment, the provision of ball lens 38 enables increase in the coupling efficiency with the external optical fiber not shown.

In the optical transceiver module 10 of the present embodiment, the casing 26 for housing the mount substrate 12 is provided to seal in the devices such as the transmitting semiconductor laser 14 and the receiving photodiode 16 mounted on the mount substrate 12, whereby it becomes feasible to secure stable operation over a long period of time. Especially, the casing 26 is composed of upper casing 32 and lower casing 34 and is configured so as to sandwich the mount substrate 12 between upper casing 32 and lower casing 34, whereby it becomes feasible to facilitate the work of placing the mount substrate 12 into casing 26.

In the fabrication method of optical transceiver module 10 according to the present embodiment, the transmitting semiconductor laser 14, monitoring photodiode 16, receiving photodiode 22, and lead pins 24 are simultaneously mounted on the upper and lower surfaces 12a, 12b of mount substrate 12 by the reflow soldering process or the like, whereby it is feasible to increase the working efficiency.

The optical transceiver module according to the second embodiment will be described below. The same reference symbols will denote the same elements as those in the optical transceiver module of the first embodiment described above, without redundant description thereof.

Figure 5:
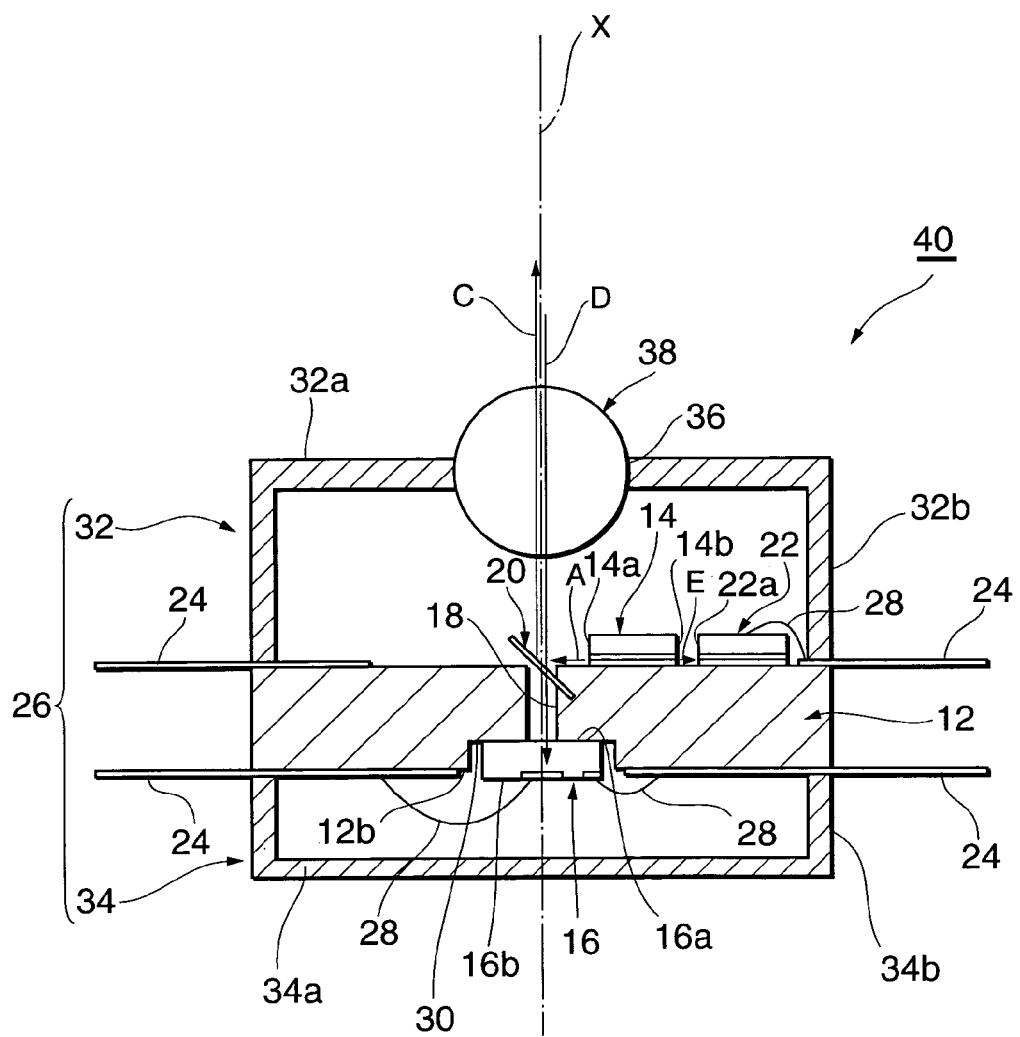
FIG. 5 is a vertical sectional view showing a configuration of the optical transceiver module according to the second embodiment.

FIG. 5 is a sectional view showing the configuration of optical transceiver module 40 according to the second embodiment. This optical transceiver module 40 is different in the configuration on the upper surface 12a side of mount substrate 12 from the optical transceiver module 10 of the first embodiment.

Specifically, in this optical transceiver module 40, monitoring photodiode 22 is located on the upper surface 12a of mount substrate 12 and on the same side as the transmitting semiconductor laser 14 is located, with respect to the filter 20. The light receiving surface 22a of monitoring photodiode 22 faces the back face 14b of transmitting semiconductor laser 14. This monitoring photodiode 22 receives the backward light from the transmitting semiconductor laser 14 to monitor the emission state of transmitting semiconductor laser 14 (cf. arrow E). The emission state of transmitting semiconductor laser 14 can be suitably controlled by carrying out the feedback control on the basis of an electric signal generated through photoelectric conversion by monitoring photodiode 22.

The optical transceiver module of the third embodiment will be described below. The same reference symbols will denote the same elements as those in the optical transceiver modules in the first and second embodiments, without redundant description thereof.

Figure 6:
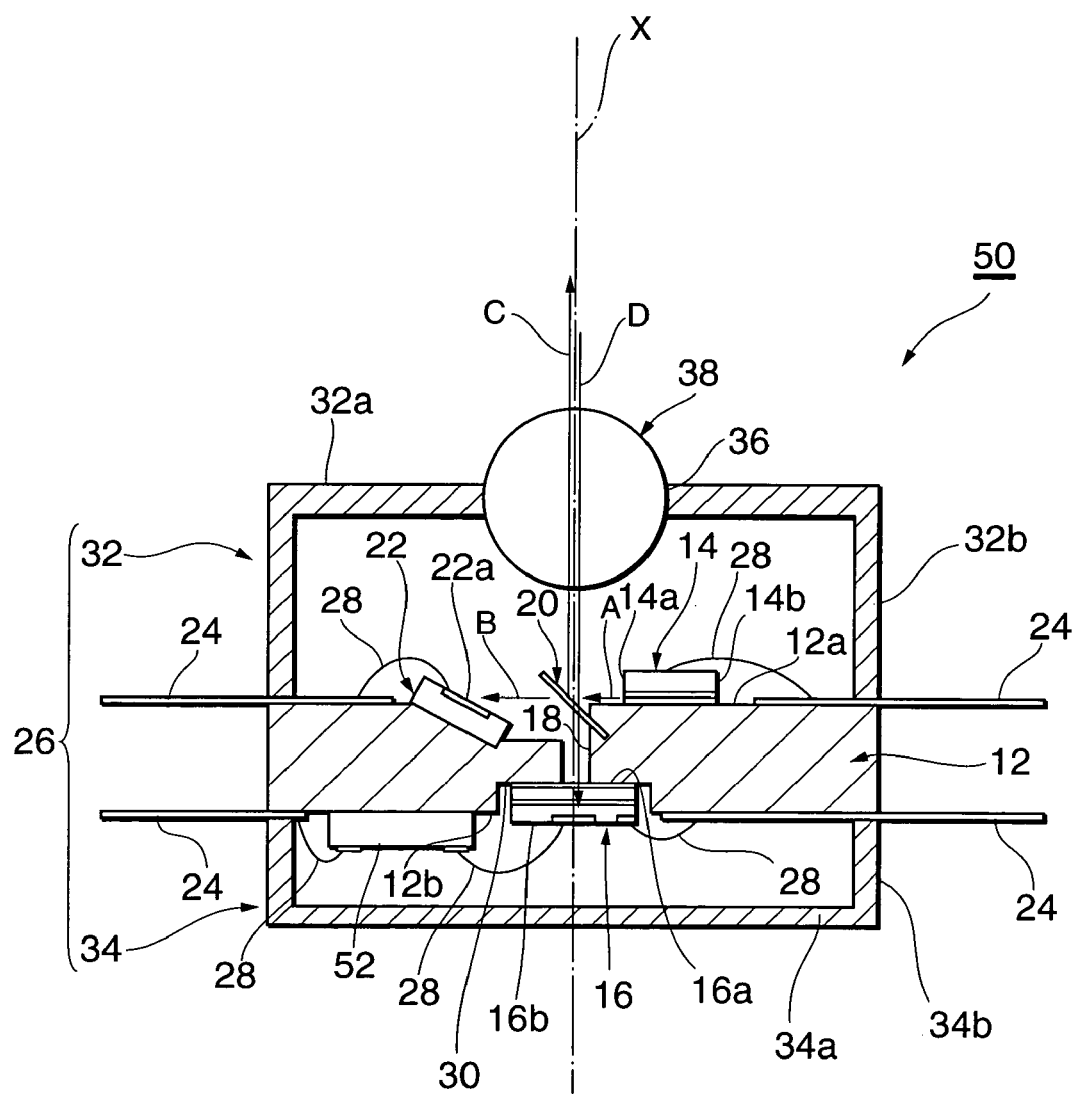
FIG. 6 is a vertical sectional view showing a configuration of the optical transceiver module according to the third embodiment.

FIG. 6 is a sectional view showing the configuration of optical transceiver module 50 in the third embodiment. This optical transceiver module 50 is different in the configuration on the lower surface 12b side of mount substrate 12 from the optical transceiver module 10 in the first embodiment.

Namely, in this optical transceiver module 50, amplifier 52 is mounted on lower surface 12b of mount substrate 12. The unrepresented P-electrode of receiving photodiode 16 is connected through bonding wire 28 to an input portion of amplifier 52 and an output portion of amplifier 52 is connected through bonding wire 28 to lead pin 24. This amplifier 52 amplifies an electric signal from receiving photodiode 16.

The electric signal from receiving photodiode 16 is very weak and susceptible to noise, and thus the electric signal is amplified by the amplifier 52 provided in the vicinity of the receiving photodiode 16, so as to improve the resistance to noise. This amplifier 52 can be constructed of Si-IC or GaAs-IC as an amplifying circuit.

Figure 7:
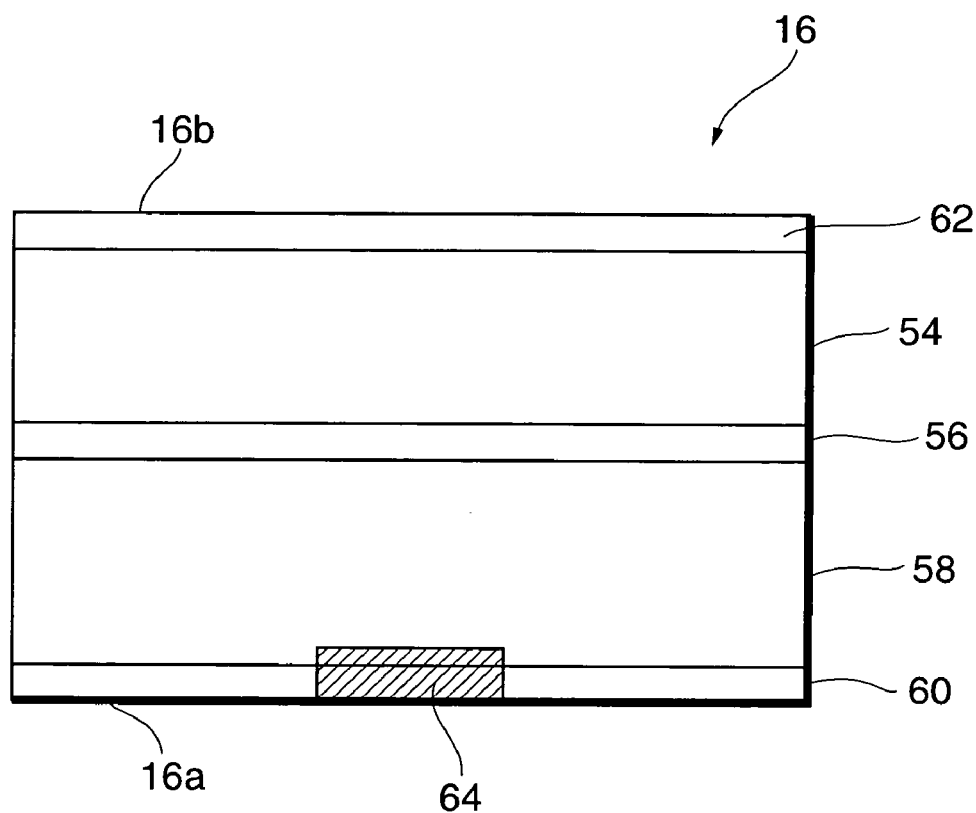
FIG. 7 is a sectional view showing a configuration of the receiving photodiode.

In this optical transceiver module 50, the configuration of receiving photodiode 16 is different from that in the optical transceiver module 10 of the first embodiment. Namely, this receiving photodiode 16 has a filter layer that absorbs the light of the second wavelength. FIG. 7 is a sectional view showing the configuration of receiving photodiode 16. As shown in FIG. 7, this receiving photodiode 16 is formed in such a layer structure that InGaAsP layer 56 of the thickness of 3 μm-5 μm ($\lambda_g$=1.4 μm), InGaAs layer 58 of the thickness of 3 μm-5 μm, and InP cap layer 60 of the thickness of 1 μm-2 μm were stacked in the order named on an upper surface of InP substrate 54 of the thickness of 200 μm-350 μm and that InGaAsP layer 62 of the thickness of 3 μm-5 μm ($\lambda_g$=1.4 μm) is laid on the back surface of the InP substrate 54. Furthermore, p$^+$ region 64 is formed by diffusion of Zn in the central region of InP cap layer 60 so that the p$^+$ region 64 penetrates into the InGaAs layer 58. These InGaAsP layers 56, 62 each function as a filter layer for absorbing the light of the first wavelength $\lambda_1$ (1.3 μm).

In this optical transceiver module 50, therefore, the light of the second wavelength $\lambda_2$ (1.55 μm) as receiving light is received with high sensitivity, while the light of the first wavelength $\lambda_1$ (1.3 μm) as transmitting light, which is a small quantity of light having propagated through the communicating hole 18, is shut out. As a result, an improvement of about 20-30 dB is made in crosstalk.

The optical transceiver module according to the fourth embodiment will be described below. The same reference symbols will denote the same elements as those in the optical transceiver modules according to the first to third embodiments described above, without redundant description thereof.

Figure 8:
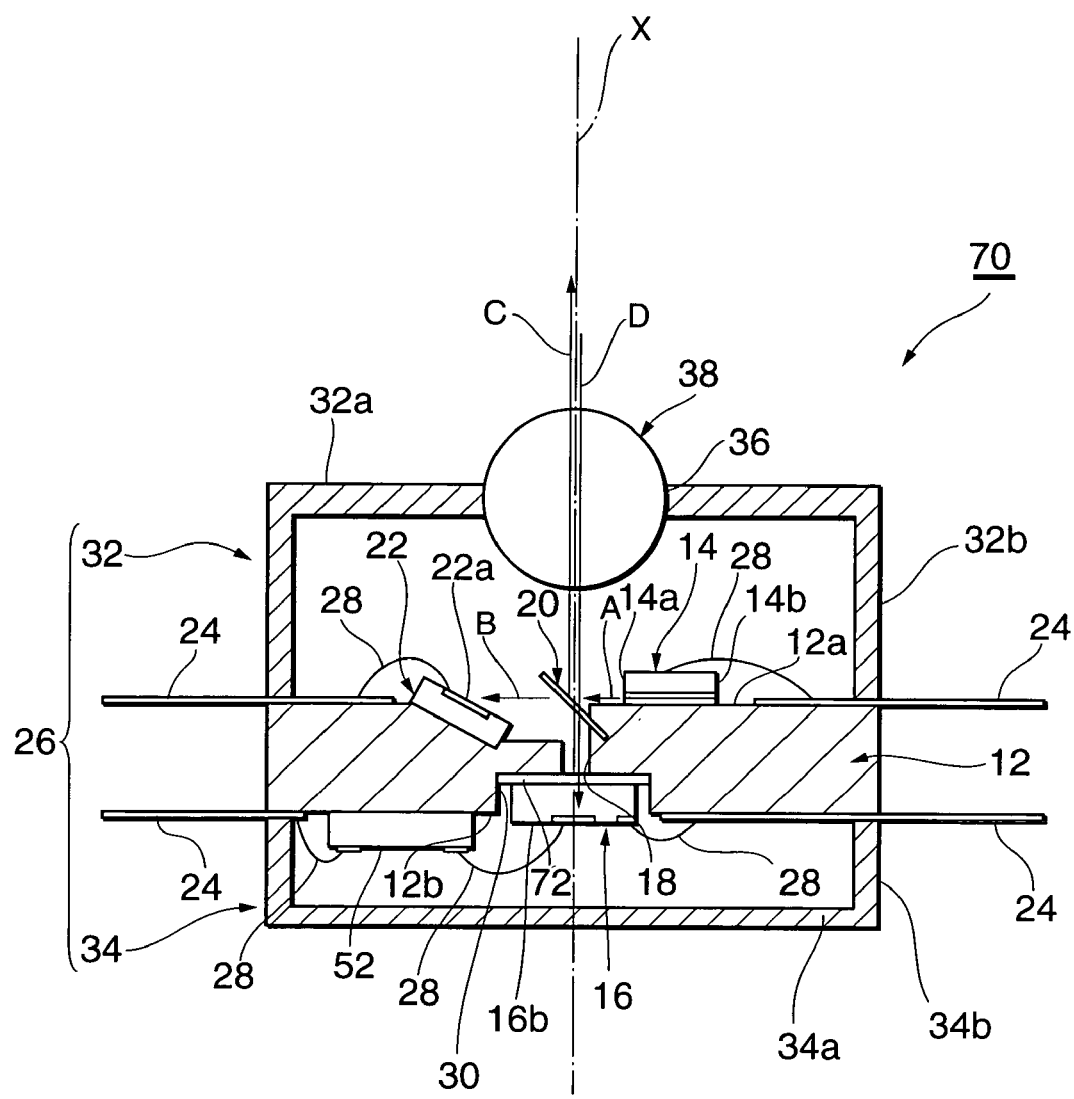
FIG. 8 is a vertical sectional view showing a configuration of the optical transceiver module according to the fourth embodiment.

FIG. 8 is a sectional view showing the configuration of optical transceiver module 70 according to the fourth embodiment. This optical transceiver module 70 is different in the configuration on the lower surface 12b side of mount substrate 12 from the optical transceiver module 10 of the first embodiment.

Namely, amplifier 52, which is similar to that in the optical transceiver module 50 in the third embodiment, is mounted on the lower surface 12b of mount substrate 12 in this optical transceiver module 70. Filter (second filter) 72, which transmits the light of the second wavelength $\lambda_2$ (1.55 μm) as receiving light but shuts out the light of the first wavelength $\lambda_1$ (1.3 μm) as transmitting light, is provided between the receiving photodiode 16 and the lower surface 12b of mount substrate 12. This filter 72 may be one absorbing the light of the first wavelength $\lambda_1$, or one reflecting it. This filter 72 can be comprised, for example, of a dielectric multilayer filter.

In the optical transceiver module 70, therefore, the light of the second wavelength $\lambda_2$ as receiving light is also received with high sensitivity, while the light of the first wavelength $\lambda_1$ as transmitting light, which is a small quantity of light having propagated through the communicating hole 18, is shut out. As a result, an improvement of about 10 to 20 dB is made in crosstalk.

The optical transceiver module according to the fifth embodiment will be described below. The same reference symbols will denote the same elements as those in the optical transceiver modules of the first to fourth embodiments described above, without redundant description thereof.

Figure 9:
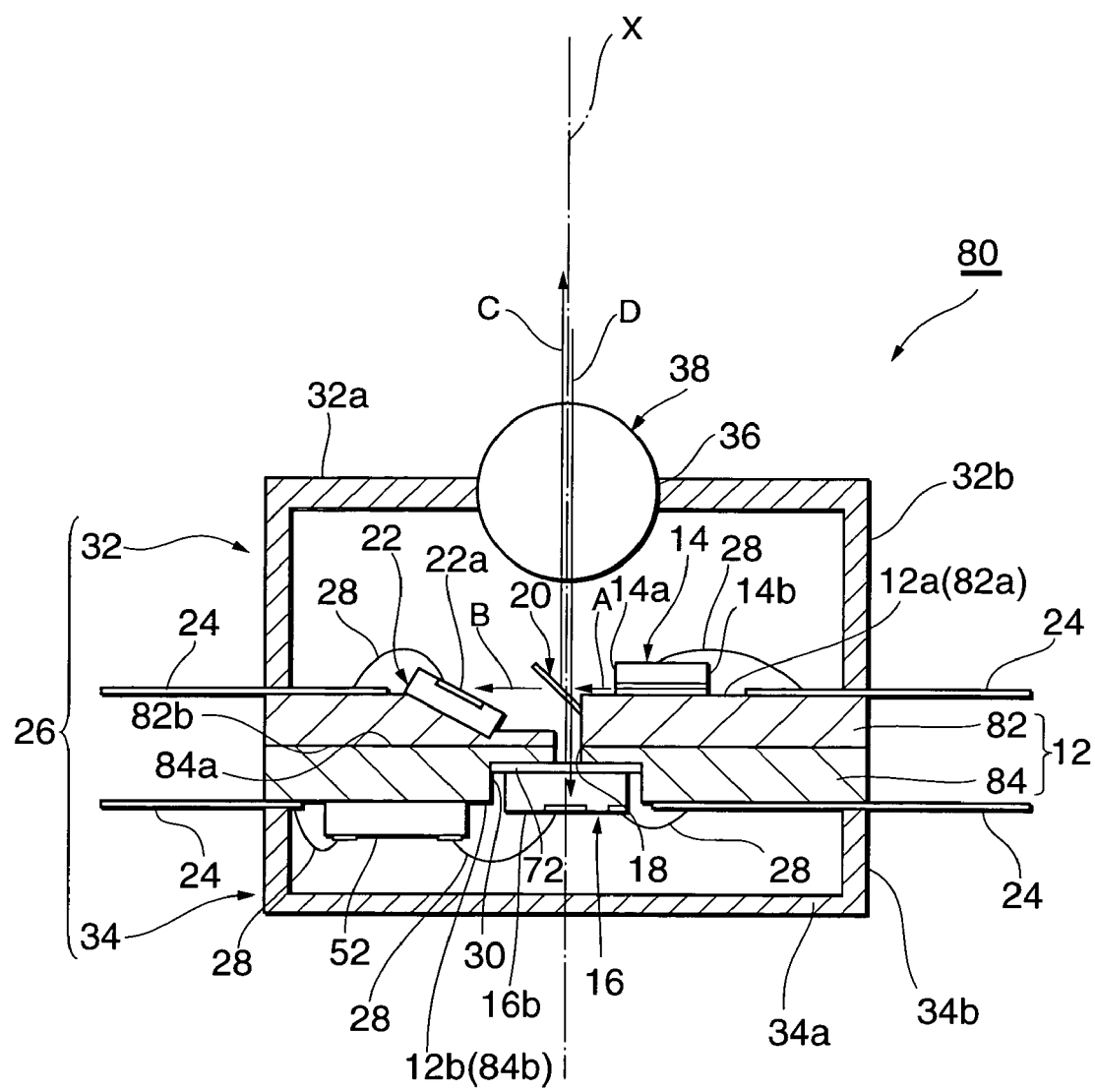
FIG. 9 is a vertical sectional view showing a configuration of the optical transceiver module according to the fifth embodiment.

FIG. 9 is a sectional view showing the configuration of optical transceiver module 80 according to the fifth embodiment. This optical transceiver module 80 is different in the configuration of mount substrate 12 from the optical transceiver module 70 of the fourth embodiment. Namely, the mount substrate 12 is composed of upper substrate (first substrate) 82 and lower substrate (second substrate) 84, which are disposed so as to be perpendicular to the optical axis X. The upper substrate 82 has upper surface (first principal surface) 82a and lower surface (third principal surface) 82b facing each other. The lower substrate 84 has upper surface (fourth principal surface) 84a and lower surface (second principal surface) 84b facing each other. The upper substrate 82 and lower substrate 84 are assembled into the mount substrate while they are bonded in a state in which the lower surface 82b of upper substrate 82 faces the upper surface 84a of lower substrate 84. Therefore, the upper surface 82a of upper substrate 82 constitutes the upper surface 12a of mount substrate 12, while the lower surface 84b of lower substrate 84 constitutes the lower surface 12b of mount substrate 12. Coaxial holes are formed in upper substrate 82 and in lower substrate 84 to form communicating hole 18, which makes the upper surface 12a and lower surface 12b of mount substrate 12 communicate with each other.

An example of fabrication of optical transceiver module 80 in the present embodiment will be described below.

Figure 10:
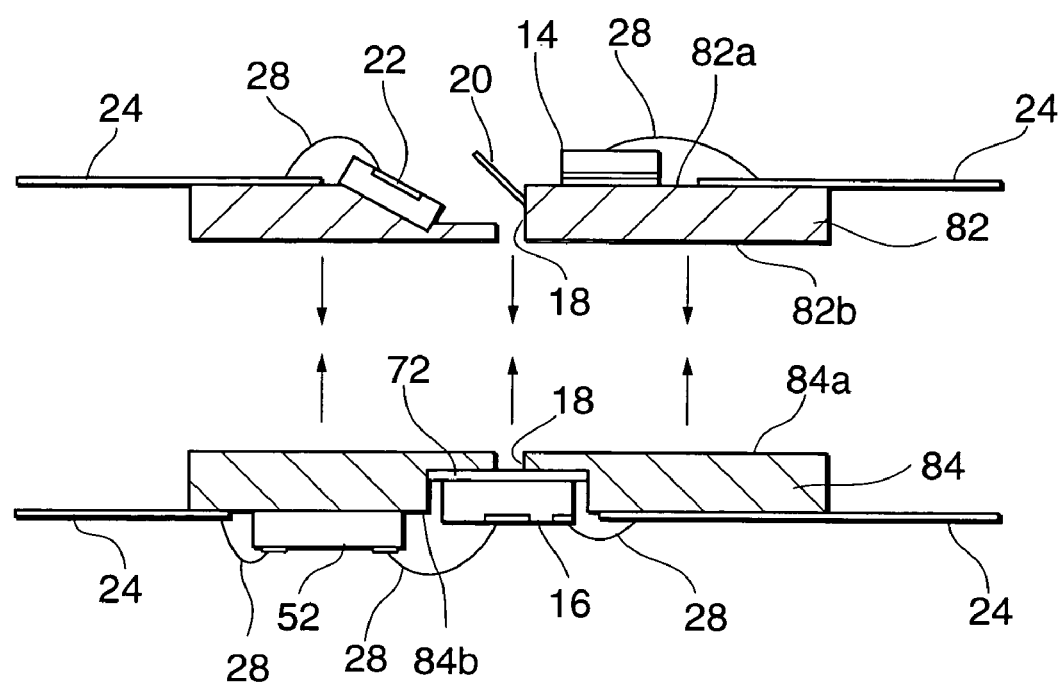
FIG. 10 is an illustration for explaining how to fabricate the optical transceiver module according to the fifth embodiment.
Figure 11:
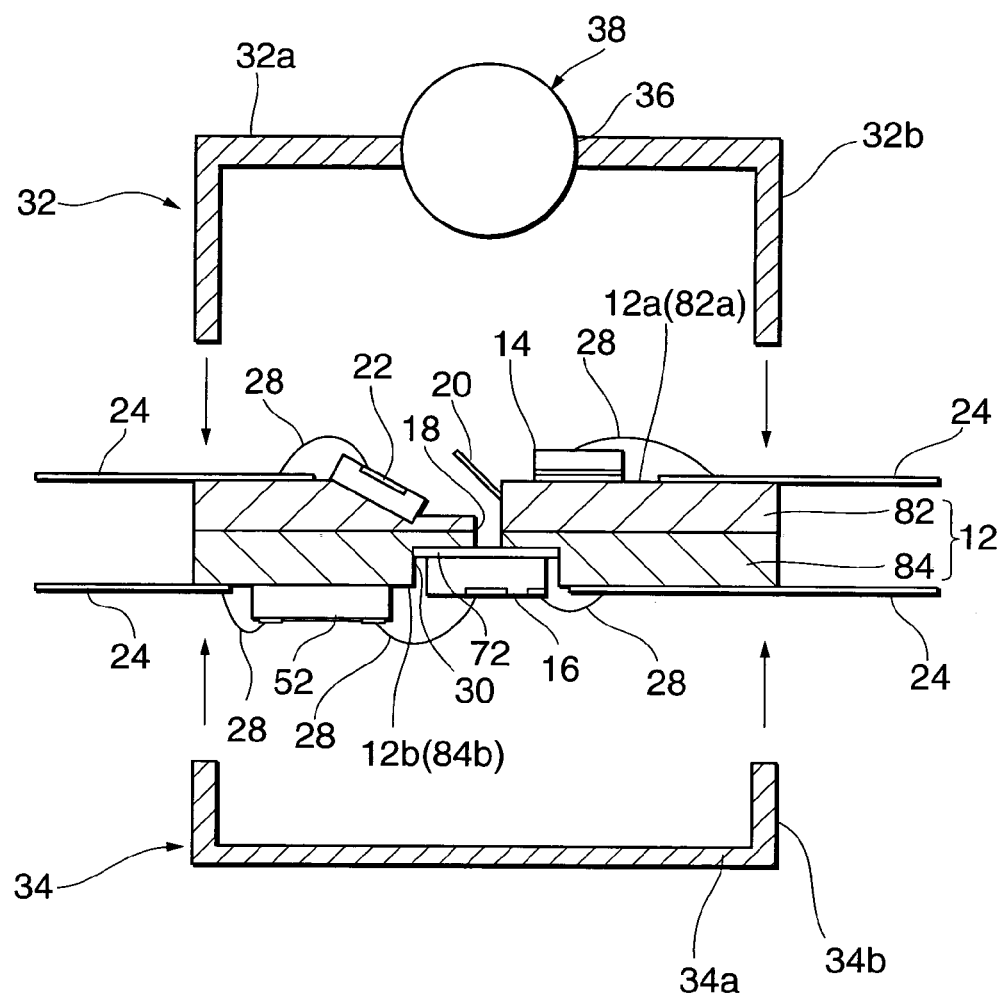
FIG. 11 is an illustration for explaining how to fabricate the optical transceiver module according to the fifth embodiment.

FIGS. 10 and 11 are illustrations for explaining how to fabricate the optical transceiver module 80 of the present embodiment. First, as shown in FIG. 10, the transmitting semiconductor laser 14, monitoring photodiode 22, lead pins 24, and filter 20 are mounted on the upper surface 82a of upper substrate 82, and bonding wires 28 are bonded, thereby forming a transmitter-side module. Then the receiving photodiode 16, amplifier 52, and lead pins 24 are mounted on the lower surface 84b of lower substrate 84, and bonding wires 28 are bonded, thereby forming a receiver-side module.

Then the transmitter-side module and the receiver-side module are separately inspected to eliminate a defective component. Thereafter, as shown in FIG. 10, the lower surface 82b of upper substrate 82 is bonded to the upper surface 84a of lower substrate 84 to assemble the transmitter-side module and the receiver-side module.

Then, as shown in FIG. 11, the upper casing 32 with ball lens 38 is placed on the upper surface 12a side of mount substrate 12, and the lower casing 34 on the lower surface 12b side of mount substrate 12 so as to sandwich the mount substrate 12 between upper casing 32 and lower casing 34 through the side wall parts 32b, 34b. The optical transceiver module 80 is fabricated in this way.

The optical transceiver module 80 and the fabrication method thereof according to the present embodiment permit the transmitter-side module with the transmitting semiconductor laser 14 being mounted on the upper substrate 82 and the receiver-side module with the receiving photodiode 16 being mounted on the lower substrate 84, to be separately fabricated and separately inspected, whereby assembly and integration of only nondefectives can decrease the defect loss and increase the yield.

When the mount substrate 12 is divided into upper substrate 82 and lower substrate 84, it becomes feasible to optimize the materials of the respective substrates in view of heat dissipation, insulation, expansion and contraction, permittivity, and so on. For example, each of upper substrate 82 and lower substrate 84 may be made of a resin material, for example, such as a liquid crystal polymer, a polyimide, or the like in view of cost, or may be made of silicon in view of heat dissipation. Each substrate may also be made of aluminum nitride (AlN) or alumina ($Al_2O_3$). It is, however, preferable to make at least one of these upper substrate 82 and lower substrate 84 of a material with the light blocking property, in order to reduce crosstalk.

The optical transceiver module according to the sixth embodiment will be described below. The same reference symbols will denote the same elements as those in the optical transceiver modules of the first to fifth embodiments described above, without redundant description thereof.

Figure 12:
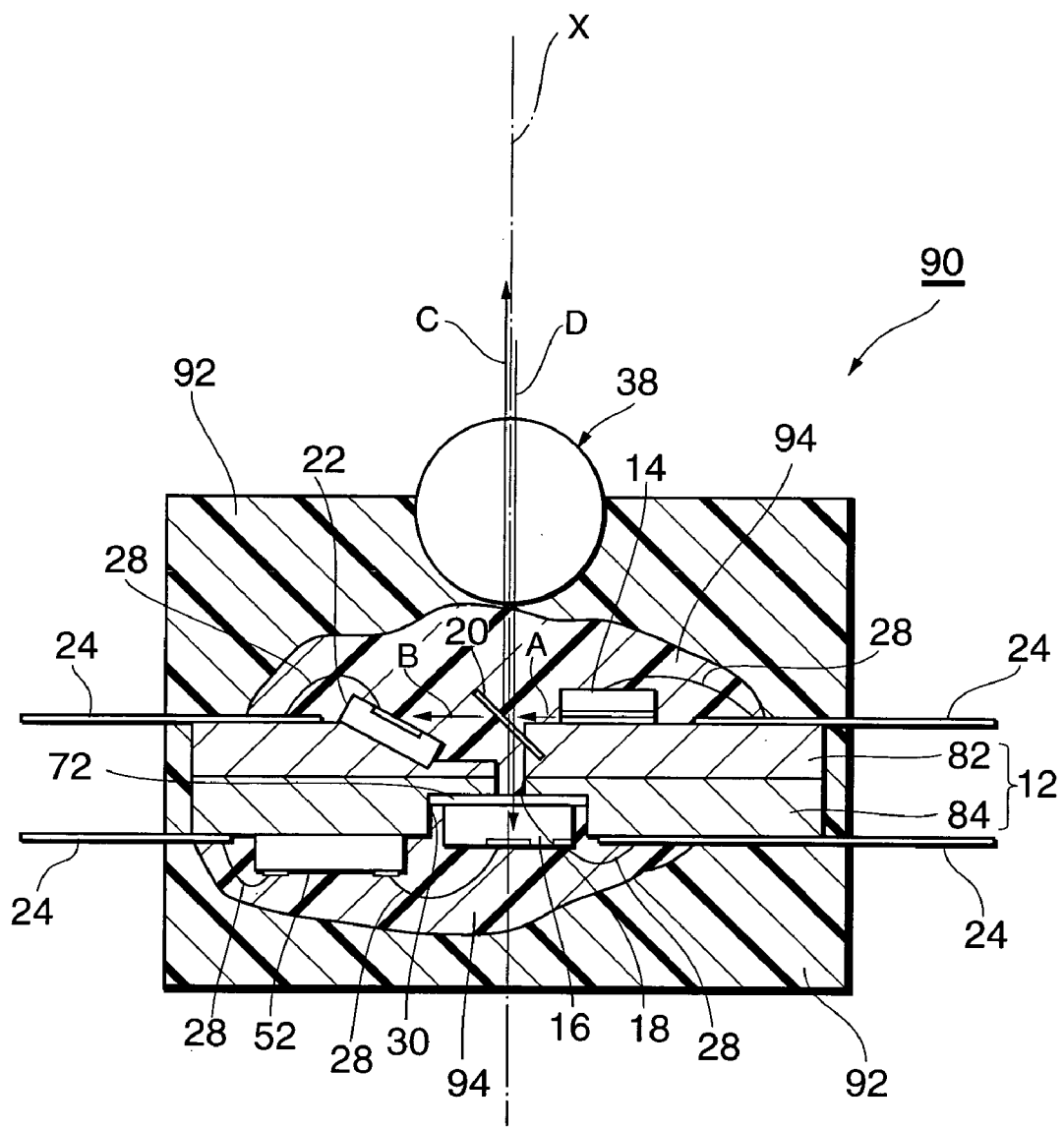
FIG. 12 is a vertical sectional view showing a configuration of the optical transceiver module according to the sixth embodiment.

FIG. 12 is a sectional view showing the configuration of optical transceiver module 90 according to the sixth embodiment. This optical transceiver module 90 is different from the optical transceiver module 80 of the fifth embodiment in that the mount substrate 12 is covered by a resin body. Namely, the mount substrate 12 was sealed in by casing 26 in the optical transceiver module 80 of the fifth embodiment, whereas the mount substrate 12 is sealed in by the resin body 92 of a resin material in the optical transceiver module 90 of the present embodiment so that ball lens 38 is buried in a resin body 92.

The resin body 92 for sealing the mount substrate 12 in can be, for example, an epoxy resin or the like. It is, however, preferable that the region including the optical paths for propagation of the transmitting light and receiving light, and the bonding wires be covered with resin 94 such as a silicone resin, an acrylic resin, or the like having the light transmitting property and being relatively soft, as shown in FIG. 12.

An example of fabrication of optical transceiver module 90 according to the present embodiment will be described below.

Figure 13:
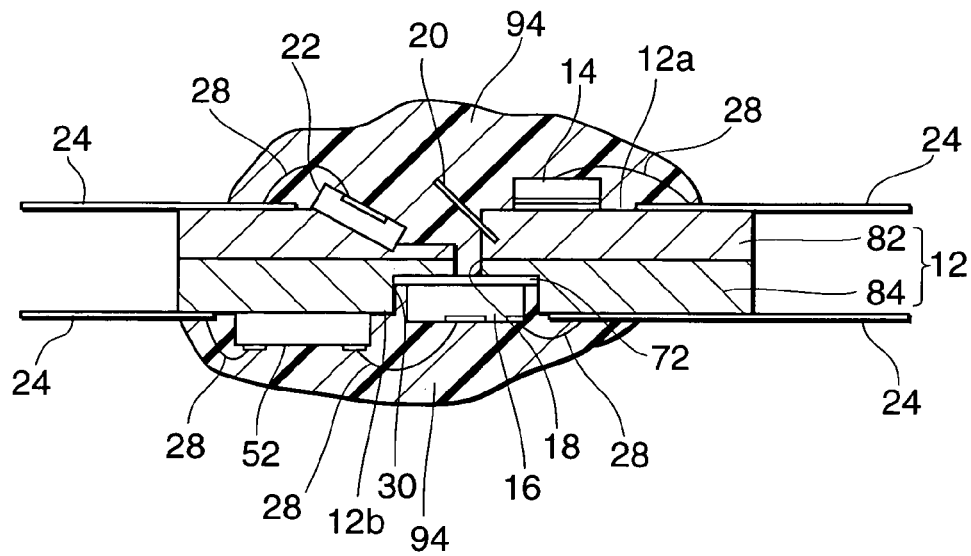
FIG. 13 is an illustration for explaining how to fabricate the optical transceiver module according to the sixth embodiment.

First, the assembly of the transmitter-side module and the receiver-side module is prepared in much the same manner as in the above fifth embodiment described with FIG. 10. Thereafter, as shown in FIG. 13, transparent and soft resin 94 such as a silicone resin or the like is delivered onto upper surface 12a and lower surface 12b of mount substrate 12 by resin potting.

Figure 14:
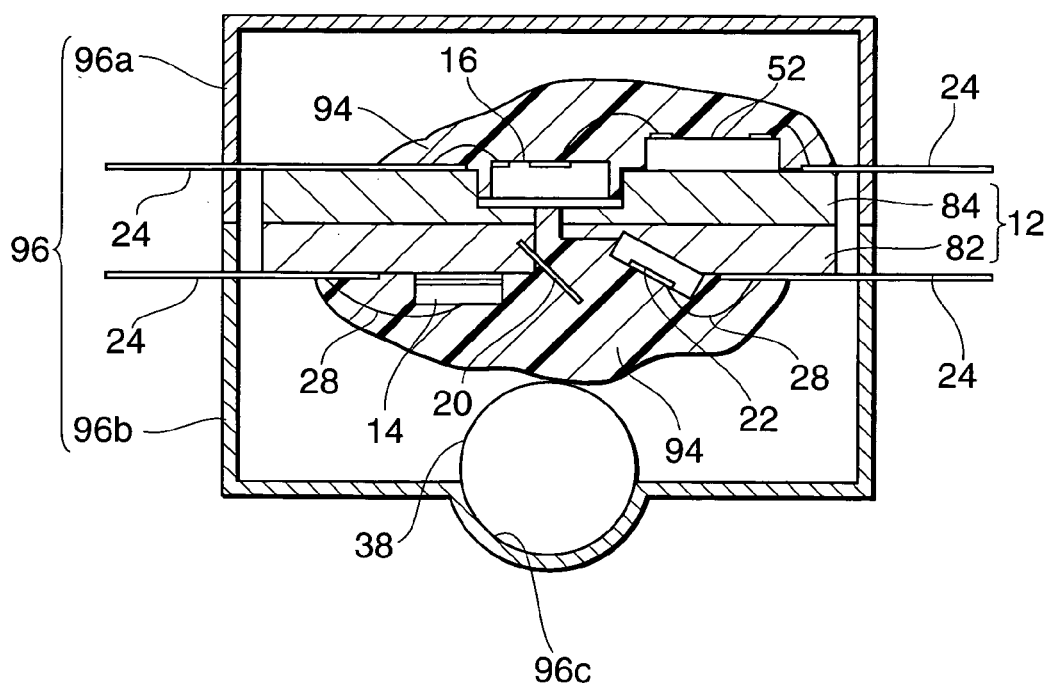
FIG. 14 is an illustration for explaining how to fabricate the optical transceiver module according to the sixth embodiment.

Thereafter, as shown in FIG. 14, the mount substrate 12 with the above resin potting part 94, and ball lens 38 are set at respective positions in mold 96 having an interior shape that can form a desired contour of a resin body 92 over the resin part 94. This mold 96 is composed of upper die 96a and lower die 96b and the lower die 96b is provided with recess 96c for positioning the ball lens 38. Then the interior of mold 96 is filled with resin 92 such as an epoxy resin or the like. The optical transceiver module 90 is fabricated in this way.

In the optical transceiver module 90 of the present embodiment, the resin body 92, 94 seals in the devices such as the transmitting semiconductor laser 14, receiving photodiode 16, monitoring photodiode 22, amplifier 52, etc. mounted on the mount substrate 12, so as to be able to secure stable operation over a long period of time. This structure implements the sealing at lower cost than in the case of the sealing by casing 26. Particularly, the ball lens 38 is buried in the resin 92, whereby it can be fixed without use of any special fixing means, so as to achieve reduction of cost.

Since the resin molding with resin 92 and the embedding of ball lens 38 can be simultaneously effected by the fabrication method of optical transceiver module 90 of the present embodiment, the production efficiency can be increased.

The optical transceiver module according to the seventh embodiment will be described below. The same reference symbols will denote the same elements as those in the optical transceiver modules of the first to sixth embodiments described above, without redundant description thereof.

Figure 15:
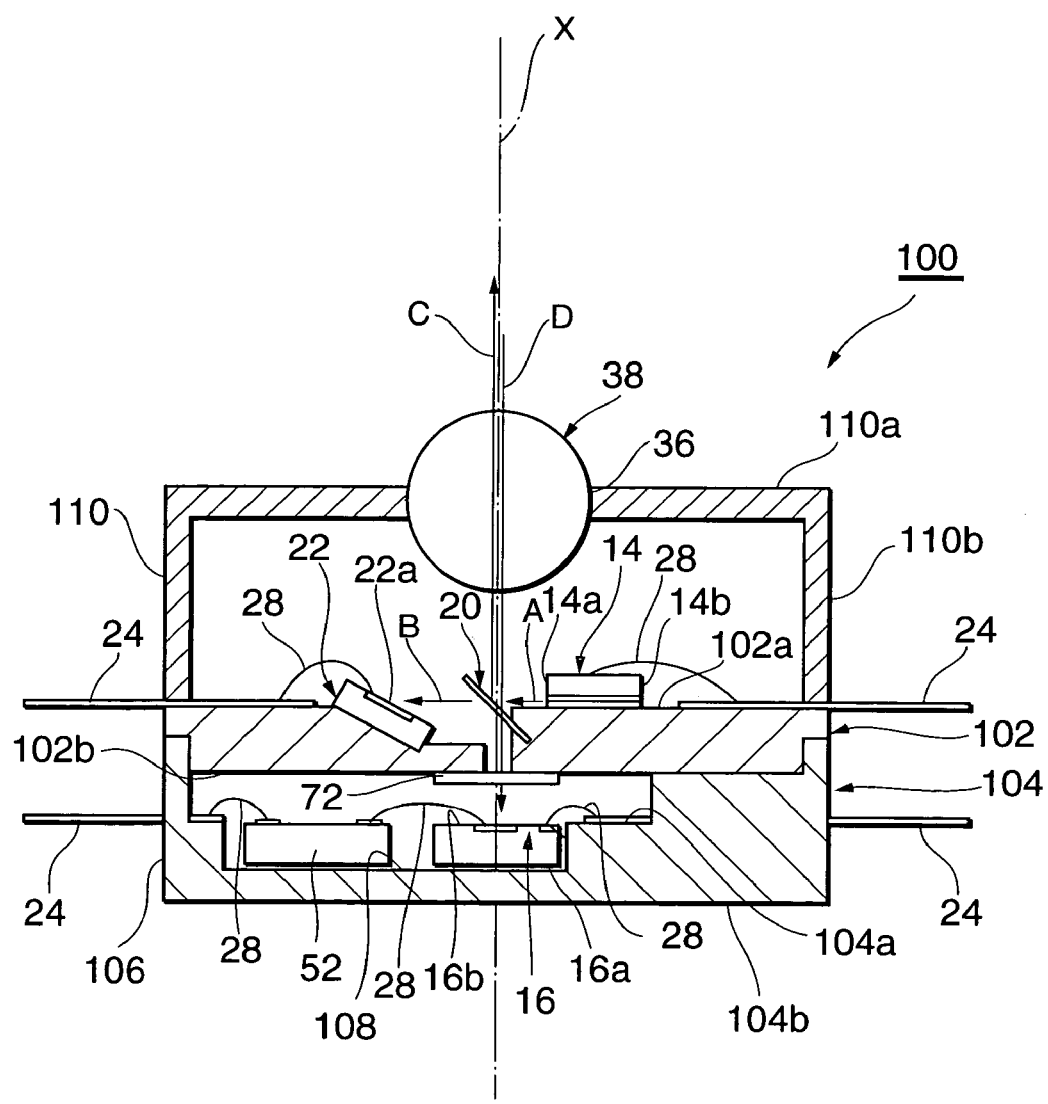
FIG. 15 is a vertical sectional view showing a configuration of the optical transceiver module according to the seventh embodiment.

FIG. 15 is a vertical sectional view showing the configuration of optical transceiver module 100 according to the seventh embodiment. As shown in FIG. 15, the optical transceiver module 100 is a module suitably applicable to single-fiber bidirectional communication, which emits the transmitting light along the optical axis X (predetermined axis) and which receives the receiving light having propagated along the optical axis X. It is also assumed in the present embodiment that the transmitting light and the receiving light is light of different wavelengths; for example, the transmitting light is light of the wavelength of 1.3 μm and the receiving light is light of the wavelength of 1.55 μm.

This optical transceiver module 100, as shown in FIG. 15, is provided with upper mount substrate (first mount substrate) 102 having upper surface (first principal surface) 102a and lower surface (second principal surface) 102b facing each other. This upper mount substrate 102 has a rectangular contour and is located so as to be perpendicular to the optical axis X. This upper mount substrate 102 is made, for example, of a resin material such as a liquid crystal polymer, a polyimide, or the like, and has the light blocking property.

Transmitting semiconductor laser 14 is mounted in the vicinity of the region of upper surface 102a of upper mount substrate 102 intersecting with the optical axis X. This transmitting semiconductor laser 14 is made, for example, of InGaAsP and emits the light of the first wavelength $\lambda_1$ (e.g., 1.3 μm). In this transmitting semiconductor laser 14, front face 14a and back face 14b are coated with a reflecting film to constitute a resonator, and the light emitted from front face 14a propagates in the direction along the upper surface 102a of mount substrate 102.

The optical transceiver module 100, as shown in FIG. 15, is also provided with lower mount substrate (second mount substrate) 104 having upper surface (third principal surface) 104a and lower surface (fourth principal surface) 104b facing each other. This lower mount substrate 104 has a rectangular contour as the upper mount substrate 102 did, and is located so as to be perpendicular to the optical axis X. This lower mount substrate 104 is made, for example, of a resin material such as a liquid crystal polymer, a polyimide, or the like. Side wall part 106 is provided in the marginal region of upper surface 104a of this lower mount substrate 104.

Receiving photodiode 16 for receiving the light of the second wavelength $\lambda_2$ (e.g., 1.55 µm) is mounted in the region of upper surface 104a of this lower mount substrate 104 intersecting with the optical axis X. This receiving photodiode 16 has the frontside-illuminated type structure, as shown in FIG. 15. Since the receiving photodiode of the frontside-illuminated type structure is most commonly available, inexpensive, and easy to mount, the working efficiency is increased thereby, so as to keep the cost down. The receiving photodiode 16 is made, for example, of InGaAs/InP and is able to receive the light of the wavelengths of 1.0 µm-1.6 µm with high sensitivity. This receiving photodiode 16 is provided with unrepresented P-electrode and N-electrode on the upper face 16b side facing the back face 16a.

These upper mount substrate 102 and lower mount substrate 104 are assembled so that the lower surface 102b of upper mount substrate 102 faces the upper surface 104a of lower mount substrate 104, through the side wall part 106 of lower mount substrate 104.

Communicating hole 18 for letting the upper surface 102a and lower surface 102b communicate with each other is provided in the region of upper mount substrate 102 intersecting with the optical axis X. This permits the receiving photodiode 16 mounted on the lower mount substrate 104 to receive the receiving light having propagated from the upper surface 102a of upper mount substrate 102, through the communicating hole 18.

Filter (first filter) 20, which reflects the light of the first wavelength $\lambda_1$ and transmits the light of the second wavelength $\lambda_2$, is provided on the optical axis X and in the region intersecting with the upper surface 102a of upper mount substrate 102. This filter 20 is comprised, for example, of a dielectric multilayer filter and is disposed at a predetermined angle (45°) relative to the optical axis X. The fixation of this filter 20 is implemented, for example, by fitting one edge of the filter into a groove provided in the upper mount substrate 102.

Monitoring photodiode 22 is mounted on the upper surface 102a of upper mount substrate 102 and on the opposite side to the transmitting semiconductor laser 14 with respect to filter 20. This monitoring photodiode 22 has the frontside-illuminated type structure and is obliquely mounted on the upper surface 102a of upper mount substrate 102 so that light receiving surface 22a thereof faces the filter 20. This monitoring photodiode 22 receives merely several % light, emitted from the front face 14a of transmitting semiconductor laser 14, which is transmitted by the filter 20. The emission state of transmitting semiconductor laser 14 can be suitably controlled by monitoring the emission state of transmitting semiconductor laser 14 by the monitoring photodiode 22 in this way and performing the feedback control based thereon. Since the monitoring photodiode 22 of the frontside-illuminated type structure is most commonly available, inexpensive, and easy to mount, the working efficiency is increased thereby, so as to keep the cost down.

Filter (second filter) 72, which transmits the light of the second wavelength $\lambda_2$ (1.55 µm) as receiving light but shuts out the light of the first wavelength $\lambda_1$ (1.3 µm) as transmitting light, is provided in the region where the communicating hole 18 is formed, on the lower surface of upper mount substrate 102. This filter 72 may be one absorbing the light of the first wavelength $\lambda_1$, or one reflecting it. This filter 72 can be comprised, for example, of a dielectric multilayer filter.

In this optical transceiver module 100, therefore, the receiving photodiode 16 receives the light of the second wavelength $\lambda_2$ as receiving light with high sensitivity, while the filter 72 shuts out the light of the first wavelength $\lambda_1$ as transmitting light. As a result, an improvement of about 10 to 20 dB is made in crosstalk.

Amplifier 52 is mounted on upper surface 104a of lower mount substrate 104. This amplifier 52 amplifies an electric signal from receiving photodiode 16. Since the electric signal from receiving photodiode 16 is very weak and susceptible to noise, the resistance to noise can be improved by disposing the amplifier 52 in the vicinity of the receiving photodiode 16 in this way and amplifying the electric signal thereby. The amplifier 52 can be constructed of Si-IC or GaAs-IC as an amplifying circuit.

Lead pins 24 for exchange of electric signals with the outside are mounted on each of upper surface 102a of upper mount substrate 102 and upper surface 104a of lower mount substrate 104. These lead pins 24 are led out through the side face to the outside. Each lead pin 24 is electrically connected through bonding wire 28 to each device such as the transmitting semiconductor laser 14, receiving photodiode 16, monitoring photodiode 22, and amplifier 52. A preferred configuration herein is, as shown in FIG. 15, that recess 108 is provided in the region where the receiving photodiode 16 and amplifier 52 are mounted, on the upper surface 104a of lower mount substrate 104 and that the receiving photodiode 16 and amplifier 52 are mounted in this recess 108; this configuration decreases the level difference between the upper surfaces of receiving photodiode 16 and amplifier 52, and the upper surface of lower mount substrate 104, so as to decrease the lengths of bonding wires 28 and enable achievement of much higher speed.

The optical transceiver module 100 of the present embodiment is provided with casing 110 for housing the upper mount substrate 102. This casing 110 is made of a metal material such as iron, copper, an iron-cobalt-nickel alloy, stainless steel, or the like, or a resin material such as an epoxy resin, a liquid crystal polymer, or the like. This casing 110 includes bottom wall part 110a extending in parallel with the upper mount substrate 102 and having almost the same area as the upper mount substrate 102, and side wall part 110b provided in the marginal region of bottom wall part 110a, and a vertical cross section thereof is of U-shape. Accordingly, the upper mount substrate 102 is sandwiched between side wall part 110b of casing 110 provided on the upper surface 102a side and the side wall part 106 of lower mount substrate 104 provided on the lower surface 102b side. Furthermore, hole 36 is formed in the region of casing 110 intersecting with the optical axis X, and ball lens 38 is fixed in this hole 36. This ball lens 38 is provided for condensing the transmitting light and the receiving light, and this increases the coupling efficiency with the external optical fiber not shown.

The operation of above-described optical transceiver module 100 according to the present embodiment will be described below.

An electric signal is supplied through lead pin 24 to activate the transmitting semiconductor laser 14, whereupon the semiconductor laser 14 emits the light of the first wavelength $\lambda_1$ from the front face thereof 14a. This light propagates along the upper surface 102a of upper mount substrate 102 to reach the filter 20 (cf. arrow A) Then part of the light, several %, is transmitted by filter 20 and received by monitoring photodiode 22 (cf. arrow B). Then the emission state of the transmitting semiconductor laser 14 is suitably controlled by monitoring the emission state of transmitting semiconductor laser 14 on the basis of information from monitoring photodiode 22 and carrying out the feedback control based thereon.

Most of the light having been emitted from the transmitting semiconductor laser 14 and having reached the filter 20 is reflected by this filter 20. The traveling direction of the light is changed by approximately 90° and the light propagates as transmitting light along the optical axis X (cf. arrow C). Then the light is condensed by ball lens 38 and is emitted toward the external optical fiber not shown.

On the other hand, the receiving light of the second wavelength $\lambda_2$ having propagated in the unrepresented external optical fiber and having propagated along the optical axis X is condensed by the ball lens 38. Then the light is transmitted by the filter 20 and travels through the communicating hole 18 of upper mount substrate 102 to be received by receiving photodiode 16 mounted on upper surface 104a of lower mount substrate 104 (cf. arrow D). Then an electric signal generated by photoelectric conversion is amplified by amplifier 52 and thereafter the amplified signal is extracted through lead pin 24 to the outside.

An example of fabrication of optical transceiver module 100 according to the present embodiment will be described below.

Figure 16:
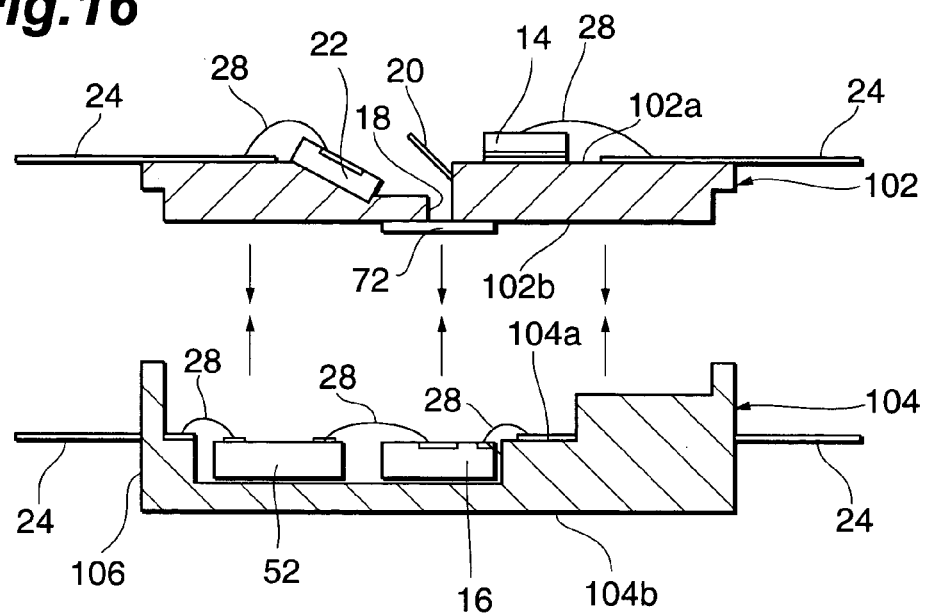
FIG. 16 is an illustration for explaining how to fabricate the optical transceiver module according to the seventh embodiment.
Figure 17:
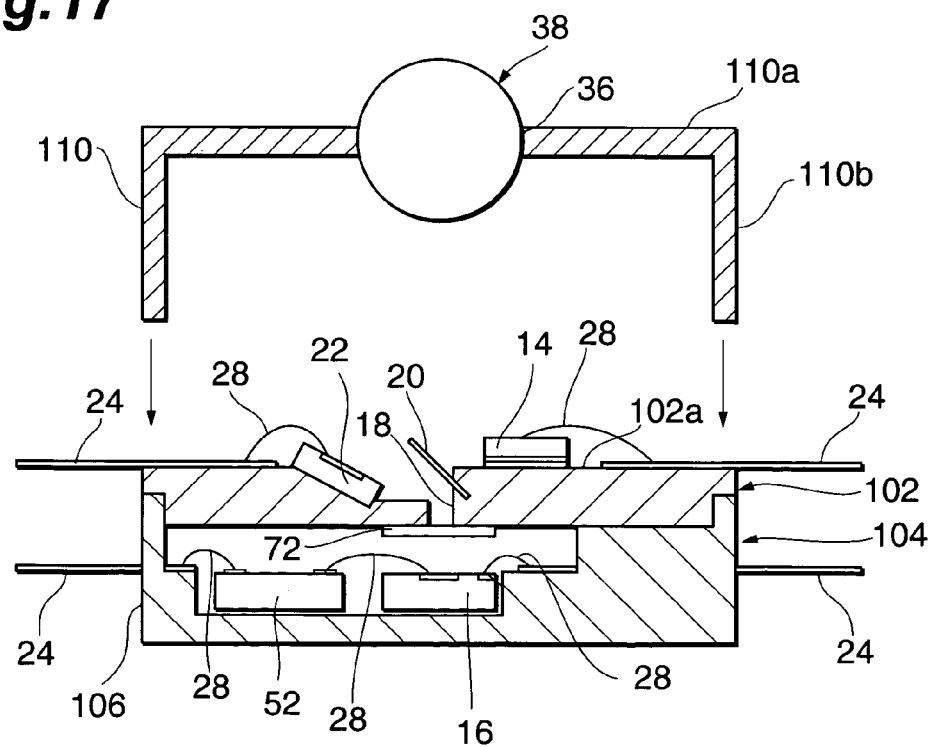
FIG. 17 is an illustration for explaining how to fabricate the optical transceiver module according to the seventh embodiment.

FIGS. 16 and 17 are illustrations for explaining how to produce the optical transceiver module 100 according to the present embodiment. As shown in FIG. 16, the transmitting semiconductor laser 14, monitoring photodiode 22, filter 20, and lead pins 24 are mounted on upper surface 102a of upper mount substrate 102, the filter 72 is placed on lower surface 102b, and bonding wires 28 is bonded, thereby forming a transmitter-side module. Then the receiving photodiode 16, amplifier 52, and lead pins 24 are mounted on upper surface 104a of lower mount substrate 104, and bonding wires 28 are bonded, thereby forming a receiver-side module.

Then the transmitter-side module and the receiver-side module are separately inspected to eliminate a defective component. Then, as shown in FIG. 16, the transmitter-side module and the receiver-side module are assembled through the side wall part 106 of lower mount substrate 104 so that the lower surface 102b of upper mount substrate 102 faces the upper surface 104a of lower mount substrate 104.

Thereafter, as shown in FIG. 17, the casing 110 with ball lens 38 is placed on the upper surface 102a side of upper mount substrate 102 to sandwich the upper mount substrate 102 between the casing 110 and lower mount substrate 104 through the side wall part 110b. The optical transceiver module 100 is fabricated in this way.

The action and effect of optical transceiver module 100 of the present embodiment will be described below.

Since the optical transceiver module 100 of the present embodiment is constructed in the configuration wherein the transmitting semiconductor laser 14 is mounted on upper mount substrate 102, wherein the receiving photodiode 16 is mounted on lower mount substrate 104, and wherein these upper mount substrate 102 and lower mount substrate 104 are assembled, the configuration decreases the number of parts and obviates the need for time and labor for assembly, so as to reduce the cost and achieve compactification of the entire module, as compared with the conventional structure wherein they are housed in the separate packages and the packages are assembled together with the ferrule. Since the configuration of the present embodiment permits the transmitter-side module with the transmitting semiconductor laser 14 and others on the upper mount substrate 102 and the receiver-side module with the receiving photodiode 16 and others on the lower mount substrate 104 to be separately fabricated and separately inspected, assembly of only nondefectives can decrease the defect loss and increase the yield.

In the optical transceiver module 100 of the present embodiment, the transmitter side and the receiver side are constructed separately from each other by mounting the transmitting semiconductor laser 14 on upper surface 102a of upper mount substrate 102 and mounting the receiving photodiode 12 on upper surface 104a of lower mount substrate 104, whereby it is feasible to decrease crosstalk.

Since in the optical transceiver module 100 of the present embodiment the upper mount substrate 102 is placed so as to be perpendicular to the optical axis X and the filter 20 reflects the light from transmitting semiconductor laser 14, it is feasible to effectively use the region of the upper surface 102a of upper mount substrate 102 on the opposite side to semiconductor laser 14 with respect to filter 20. For example, the region of the upper surface 102a of upper mount substrate 102 is effectively utilized by mounting the monitoring photodiode 22 on the opposite side to the transmitting semiconductor laser 14 with respect to filter 20 in the present embodiment.

The transmitting light emitted from the transmitting semiconductor laser 14 can be suitably controlled by mounting the monitoring photodiode 22 as described above and thereby monitoring the light transmitted by the filter 20. The use of the monitoring photodiode 22 of the frontside-illuminated type structure can keep down the cost, in view of the working efficiency as well as the price thereof.

Since the optical transceiver module 100 of the present embodiment employs the receiving photodiode 16 of the frontside-illuminated type structure as well, it is feasible to keep down the cost, in view of the working efficiency as well as the price thereof.

In the optical transceiver module 100 of the present embodiment, the provision of ball lens 38 enables increase in the coupling efficiency with the external optical fiber not shown.

In the optical transceiver module 100 of the present embodiment, the casing 110 for housing the upper mount substrate 102 is provided to seal in the devices such as the transmitting semiconductor laser 14 and others mounted on the upper mount substrate 102, so as to be able to secure stable operation over a long period of time. The lower mount substrate 104 is also made to function as a casing to seal in the devices such as the receiving photodiodes 16 and others, whereby it becomes feasible to secure stable operation over a long period of time. Particularly, since the upper mount substrate 102 is sandwiched between casing 110 and lower mount substrate 104, it becomes feasible to facilitate the sealing of the module.

The optical transceiver module 100 and the fabrication method thereof according to the present embodiment permit the transmitter-side module with the transmitting semiconductor laser 14 and others on the upper mount substrate 102 and the receiver-side module with the receiving photodiode 16 and others on the lower mount substrate 104 to be separately fabricated and separately inspected, whereby assembly and integration of only nondefectives can decrease the defect loss and increase the yield.

By utilizing the upper mount substrate 102 and the lower mount substrate 104, it becomes feasible to optimize the materials of the respective substrates in view of heat dissipation, insulation, expansion and contraction, permittivity, and so on. For example, each of upper mount substrate 102 and lower mount substrate 104 may be made of a resin material, for example, such as a liquid crystal polymer, a polyimide, or the like in view of cost, or may be made of silicon in view of heat dissipation. Each substrate may also be made of aluminum nitride (AlN) or alumina ($Al_2O_3$). It is, however, preferable to make the upper mount substrate 102 of a material with the light blocking property, in order to reduce crosstalk.

The optical transceiver module according to the eighth embodiment will be described below. The same reference symbols will denote the same elements as those in the optical transceiver modules of the first to seventh embodiments described above, without redundant description thereof.

Figure 18:
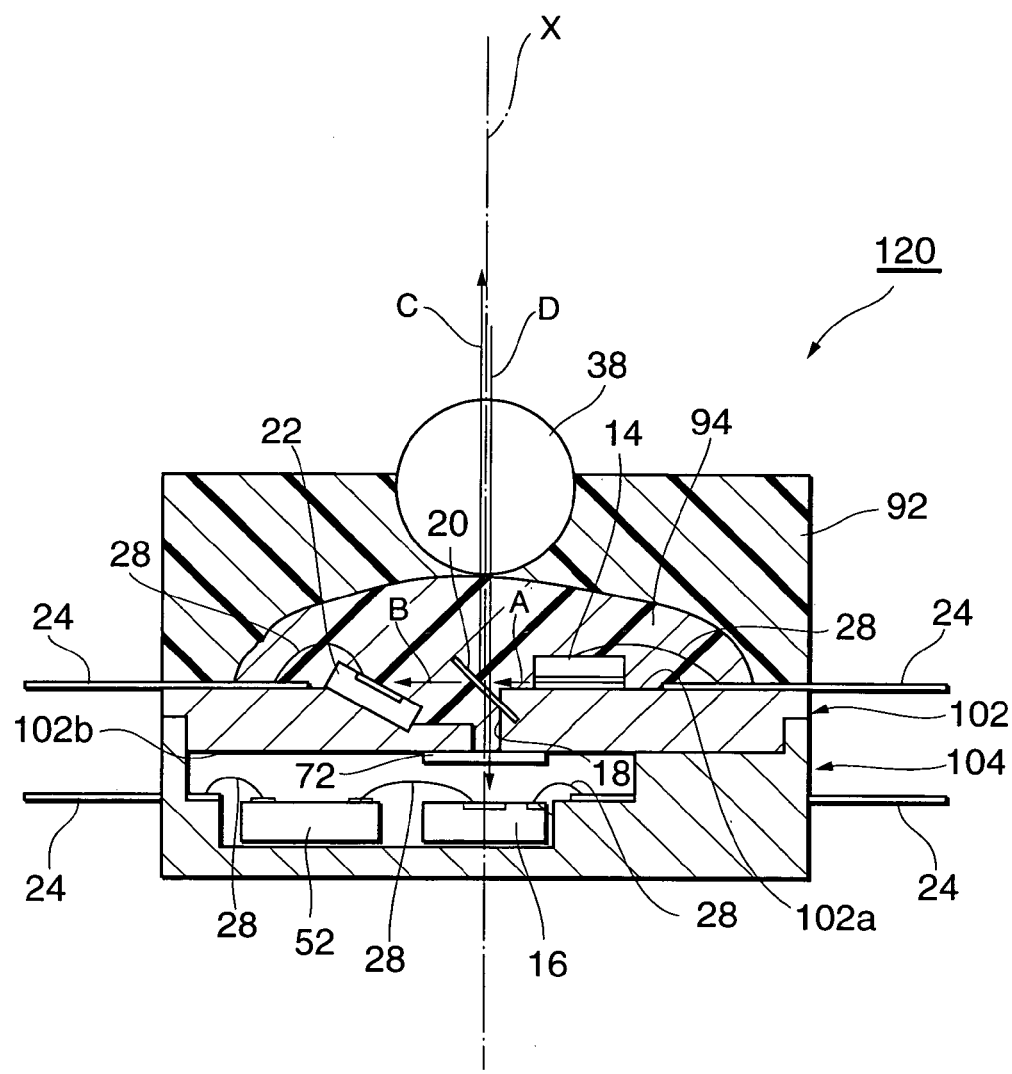
FIG. 18 is a vertical sectional view showing a configuration of the optical transceiver module according to the eighth embodiment.

FIG. 18 is a sectional view showing the configuration of optical transceiver module 120 according to the eighth embodiment. This optical transceiver module 120 is different from the optical transceiver module 100 of the seventh embodiment in that the upper surface 102a of upper mount substrate 102 is covered by a resin body. Namely, upper surface 102a of upper mount substrate 102 was sealed in by casing 110 in the optical transceiver module 100 of the seventh embodiment, whereas upper surface 102a of upper mount substrate 102 is sealed in by the resin body of a resin material in the optical transceiver module 120 of the present embodiment so that ball lens 38 is buried in a resin body 92.

The resin body 92 for sealing upper surface 102a of upper mount substrate 102 in can be, for example, an epoxy resin or the like. It is, however, preferable that the region including the optical paths for propagation of the transmitting light and receiving light and the bonding wires be covered with resin 94 such as a silicone resin, an acrylic resin, or the like having the light transmitting property and being relatively soft, as shown in FIG. 18.

An example of fabrication of optical transceiver module 120 according to the present embodiment will be described below.

Figure 19:
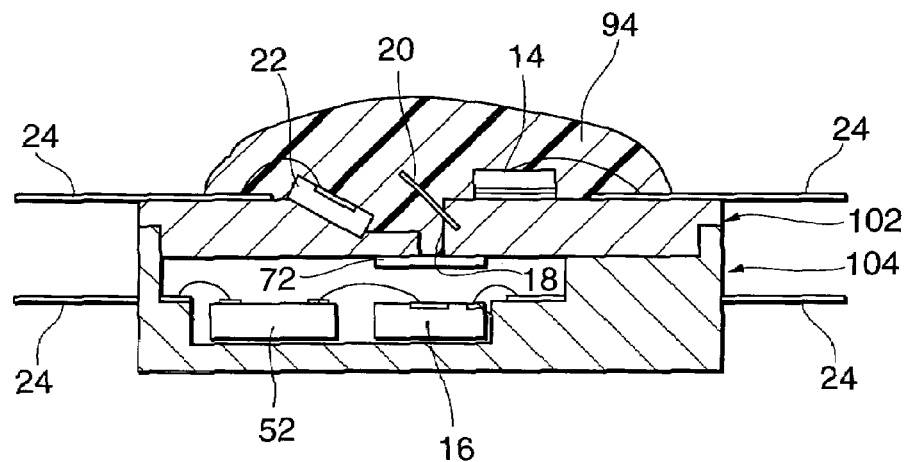
FIG. 19 is an illustration for explaining how to fabricate the optical transceiver module according to the eighth embodiment.

First, the assembly of the transmitter-side module and the receiver-side module is prepared in much the same manner as in the above seventh embodiment described with FIG. 16. Thereafter, as shown in FIG. 19, transparent and soft resin 94 such as a silicone resin or the like is delivered onto upper surface 102a of upper mount substrate 102 by resin potting.

Figure 20:
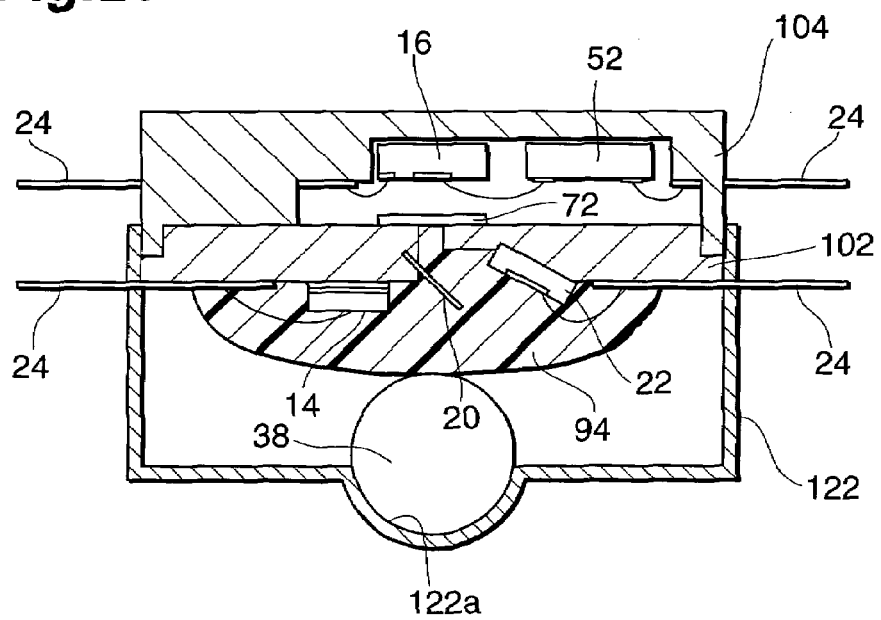
FIG. 20 is an illustration for explaining how to fabricate the optical transceiver module according to the eighth embodiment.

Thereafter, as shown in FIG. 20, the upper mount substrate 102 and lower mount substrate 104 with the above resin potting part, and the ball lens 34 are set at their respective positions in mold 122 having an interior shape that can form a desired contour of a resin body 92 over the resin part 94. This mold 122 is provided with recess 122a for positioning the ball lens 38. Then the interior of mold 122 is filled with resin 92 such as an epoxy resin or the like. The optical transceiver module 120 is fabricated in this way.

In the optical transceiver module 120 of the present embodiment, the resin body 92, 94 seals in the devices such as the transmitting semiconductor laser 14 on the upper mount substrate 102, the receiving photodiode 16, and others, so as to be able to secure stable operation over a long period of time. This structure implements the sealing at lower cost than in the case of the sealing by casing 110. Particularly, the ball lens 38 is buried in the resin body 92, whereby it can be fixed without use of any special fixing means, so as to achieve reduction of cost.

Since the resin molding with resin 92 and the embedding of ball lens 38 can be simultaneously effected by the fabrication method of optical transceiver module 120 of the present embodiment, the production efficiency can be increased.

The optical transceiver module according to the ninth embodiment will be described below. The same reference symbols will denote the same elements as those in the optical transceiver modules of the first to eighth embodiments described above, without redundant description thereof.

Figure 21:
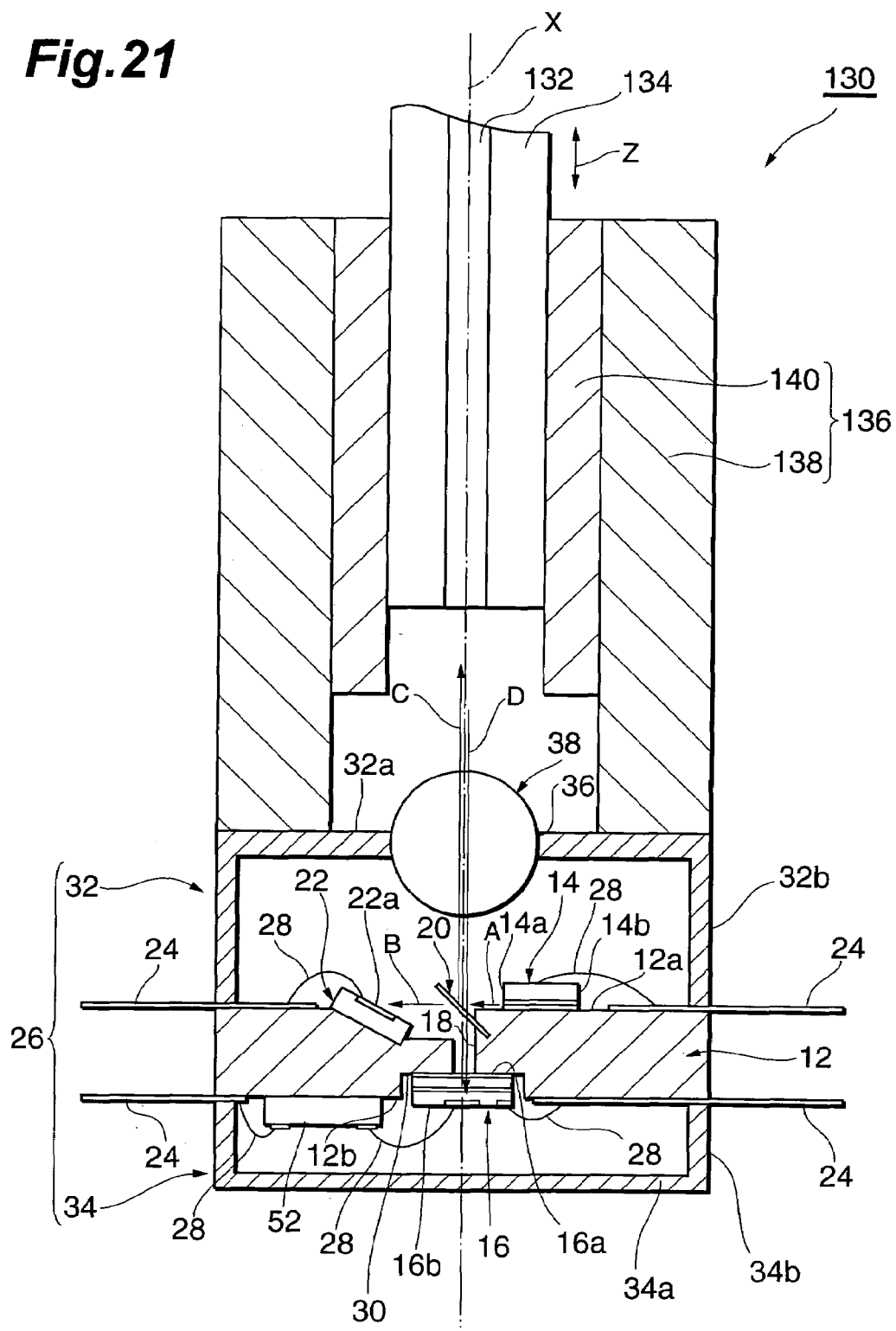
FIG. 21 is a vertical sectional view showing a configuration of the optical transceiver module according to the ninth embodiment.

FIG. 21 is a sectional view showing the configuration of optical transceiver module 130 according to the ninth embodiment. This optical transceiver module 130 has the same basic configuration as the optical transceiver module 50 of the third embodiment, and is further provided with fit portion 136 for holding ferrule 134 with external optical fiber 132 therein in a fit state. This fit portion 136 is provided on bottom wall part 32a of upper casing 32. This fit portion 136 has first sleeve 138 of cylindrical shape extending along the optical axis X, and second sleeve 140 of cylindrical shape coaxially disposed inside the first sleeve 138. The first sleeve 138 is made of a material such as stainless steel, Kobar, brass, or the like. On the other hand, the second sleeve 140 is made of a material such as stainless steel, zirconia, alumina, or the like.

This permits the ferrule 134 with external optical fiber 132 therein to be fixed so as to be detachable in the direction indicated by arrow Z in the second sleeve 140 of fit portion 136.

Since the optical transceiver module 130 of the present embodiment is provided with the fit portion 136, it becomes feasible to readily implement satisfactory optical coupling with external optical fiber 132.

Figure 22:
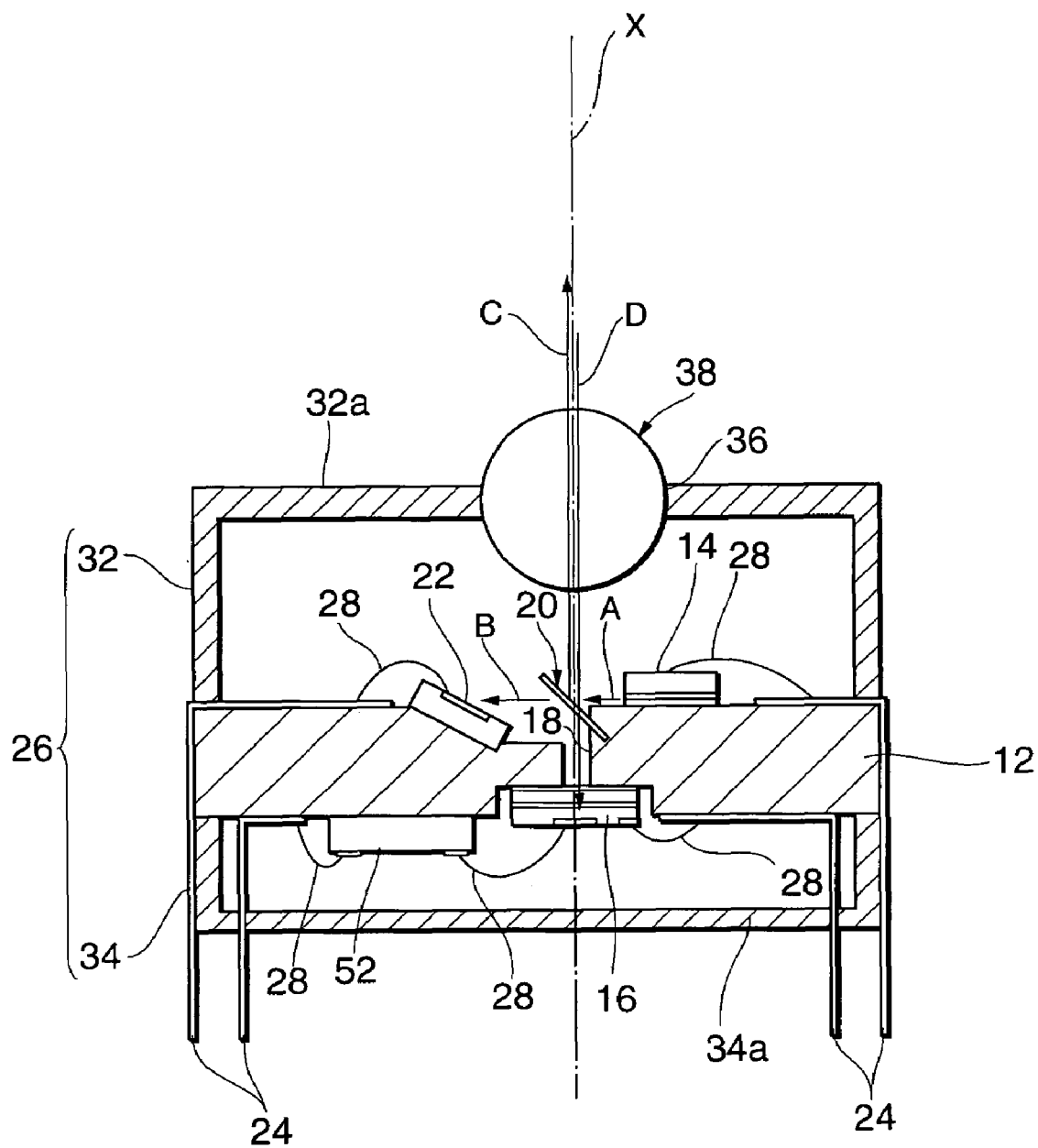
FIG. 22 is an illustration for explaining a state in which lead pins are bent to extend along the optical axis X.

The present invention can be modified in various ways, without having to be limited to the above embodiments. For example, as shown in FIG. 22, the lead pins 24 may be bent so as to extend in the direction along the optical axis X.

The casing may also be configured so as to house the mount substrate 12 completely inside, different from the configuration wherein the side face of mount substrate 12 constitutes part of the casing.

The fit portion 136 described about the optical transceiver module 130 of the ninth embodiment may also be provided in the optical transceiver modules of the other embodiments. Just as in this case, the components described about the optical transceiver modules of the first to ninth embodiments can be used in appropriate combination without departing from the spirit of the present invention.

As detailed above, the present invention provides the compact optical transceiver modules and fabrication methods thereof capable of achieving reduction of cost.

It is apparent from the above description of the present invention that the present invention can be modified in various ways. Such modifications are embraced in the present invention without departing from the spirit and scope of the present invention and all improvements obvious to those skilled in the art are included in the scope of the claims which follow.

What is claimed is:

1. An optical transceiver module for emitting transmitting light along a predetermined axis and receiving light having propagated along the predetermined axis, said optical transceiver module comprising:
    a mount substrate disposed so as to intersect with the predetermined axis and having first and second principal surfaces facing each other;
    a transmitting semiconductor laser mounted on the first principal surface and configured to emit light of a first wavelength;
    a receiving photodiode mounted on the predetermined axis and on the second principal surface and configured to receive light of a second wavelength;

a communicating hole provided in a region of the mount substrate where the receiving photodiode is mounted, and letting the first and second principal surfaces communicate with each other;

a first filter disposed on the predetermined axis and in a region intersecting with the first principal surface, and configured to reflect the light of the first wavelength and transmit the light of the second wavelength;

a lens for condensing the transmitting light and the receiving light, said lens being located on the predetermined axis so that the first filter is interposed between the receiving photodiode and the lens; and a casing for housing the mount substrate;

the casing comprising:

a first casing portion located on the first principal surface side; and a second casing portion located on the second principal surface side, wherein the mount substrate is housed in the casing and sandwiched between the first casing portion and the second casing portion, and wherein the light of the first wavelength having been emitted from the transmitting semiconductor laser and propagating along the first principal surface is reflected by the first filter, condensed by the lens and emitted as the transmitting light along the predetermined axis, and wherein the light of the second wavelength as the receiving light having propagated along the predetermined axis is condensed by the lens, transmitted by the first filter and travels through the communicating hole to be received by the receiving photodiode.

2. The optical transceiver module according to claim 1, comprising a monitoring photodiode mounted on the first principal surface of the mount substrate so as to interpose the transmitting semiconductor laser between the first filter and the monitoring photodiode, and configured to receive backward light from the transmitting semiconductor laser.

3. The optical transceiver module according to claim 1, comprising a monitoring photodiode mounted on the first principal surface of the mount substrate so as to interpose the first filter between the transmitting semiconductor laser and the monitoring photodiode, and configured to receive light emitted from the transmitting semiconductor laser and transmitted by the first filter, wherein the monitoring photodiode is obliquely mounted on the first principal surface of the mount substrate in a location where a light receiving surface of the monitoring photodiode faces the first filter.

4. The optical transceiver module according to claim 1, wherein the receiving photodiode has a backside-illuminated type structure.

5. The optical transceiver module according to claim 4, wherein a second filter for shutting out the light of the first wavelength is provided between the receiving photodiode and the second principal surface of the mount substrate.

6. The optical transceiver module according to claim 4, wherein the receiving photodiode has a filter layer for absorbing the light of the first wavelength.

7. The optical transceiver module according to claim 1, comprising an amplifier mounted on the second principal surface and configured to amplify an electric signal from the receiving photodiode.

8. The optical transceiver module according to claim 1, wherein the mount substrate comprises:

a first substrate including the first principal surface and a third principal surface facing the first principal surface; and a second substrate including the second principal surface and a fourth principal surface facing the second principal surface, wherein the mount substrate is formed by assembling the first and second substrate in a state in which the third and fourth principal surface face each other.

9. The optical transceiver module according to claim 1, comprising a fit portion provided on the first principal surface side of the mount substrate and configured to hold a ferrule with an optical fiber therein in a fit state.

10. An optical transceiver module for emitting transmitting light along a predetermined axis and receiving light having propagated along the predetermined axis, said optical transceiver module comprising:

a first mount substrate disposed so as to intersect with the predetermined axis and having first and second principal surfaces facing each other;

a transmitting semiconductor laser mounted on the first principal surface and configured to emit light of a first wavelength;

a communicating hole provided in a region where the predetermined axis intersects with the first mount substrate, and letting the first and second principal surfaces communicate with each other;

a second mount substrate disposed so as to intersect with the predetermined axis and having third and fourth principal surfaces facing each other;

a receiving photodiode mounted on the predetermined axis and on the third principal surface and configured to receive light of a second wavelength;

a first filter disposed on the predetermined axis and in a region intersecting with the first principal surface, and configured to reflect the light of the first wavelength and transmit the light of the second wavelength;

a lens for condensing the transmitting light and the receiving light, said lens being located on the predetermined axis so that the first filter is interposed between the receiving photodiode and the lens; and a casing located on the first principal surface side of the first mount substrate, the casing fixing the lens;

wherein the first mount substrate and the second mount substrate are assembled so that the second principal surface faces the third principal surface, the first mount substrate is sandwiched between the casing and the second mount substrate, and the light of the first wavelength having been emitted from the transmitting semiconductor laser and propagating along the first principal surface is reflected by the first filter, condensed by the lens and emitted as the transmitting light along the predetermined axis, and wherein the light of the second wavelength as the receiving light having propagated along the predetermined axis is condensed by the lens, transmitted by the first filter and travels through the communicating hole to be received by the receiving photodiode.

11. The optical transceiver module according to claim 10, comprising a monitoring photodiode mounted on the first principal surface of the first mount substrate so as to interpose the transmitting semiconductor laser between the first filter and the monitoring photodiode, and configured to receive backward light from the transmitting semiconductor laser.

12. The optical transceiver module according to claim 10, comprising a monitoring photodiode mounted on the first principal surface of the first mount substrate so as to interpose the first filter between the transmitting semiconductor laser and the monitoring photodiode, and configured to receive light emitted from the transmitting semiconductor laser and transmitted by the first filter,
 wherein the monitoring photodiode is obliquely mounted on the first principal surface of the mount substrate where a light receiving surface of the monitoring photodiode faces the first filter.

13. The optical transceiver module according to claim 10, wherein the receiving photodiode has a frontside-illuminated type structure.

14. The optical transceiver module according to claim 10, wherein a second filter for shutting out the light of the first wavelength is provided on the second principal surface in the region where the communicating hole in the first mount substrate is provided.

15. The optical transceiver module according to claim 10, comprising an amplifier mounted on the third principal surface of the second mount substrate and configured to amplify an electric signal from the receiving photodiode.

16. The optical transceiver module according to claim 10, comprising a fit portion provided on the first principal surface side of the first mount substrate and configured to hold a ferrule with an optical fiber therein in a fit state.

17. An optical transceiver module for emitting transmitting light along a predetermined axis and receiving light having propagated along the predetermined axis, said optical transceiver module comprising:
 a mount substrate disposed so as to intersect with the predetermined axis and having first and second principal surfaces facing each other;
 a transmitting semiconductor laser mounted on the first principal surface and configured to emit light of a first wavelength;
 a receiving photodiode mounted on the predetermined axis and on the second principal surface and configured to receive light of a second wavelength;
 a communicating hole provided in a region of the mount substrate intersecting with the predetermined axis, and letting the first and second principal surfaces communicate with each other; and
 a first filter disposed on the predetermined axis and in a region intersecting with the first principal surface, and configured to reflect the light of the first wavelength and transmit the light of the second wavelength,
 a lens for condensing the transmitting light and the receiving light, said lens being located on the predetermined axis so that the first filter is interposed between the receiving photodiode and the lens; and
 a casing for housing the mount substrate;
 the casing comprising:
 a first casing portion located on the first principal surface side; and
 a second casing portion located on the second principal surface side,
 wherein the mount substrate is housed in the casing in a state in which the mount substrate is sandwiched between the first casing portion and the second casing portion, and
 wherein the light of the first wavelength having been emitted from the transmitting semiconductor laser and propagating along the first principal surface is reflected by the first filter, condensed by the lens and emitted as the transmitting light along the predetermined axis, and wherein the light of the second wavelength as the receiving light having propagated along the predetermined axis is condensed by the lens, transmitted by the first filter and travels through the communicating hole to be received by the receiving photodiode.

18. An optical transceiver module for emitting transmitting light along a predetermined axis and receiving light having propagated along the predetermined axis, said optical transceiver module comprising:
 a mount substrate disposed so as to intersect with the predetermined axis and having first and second principal surfaces facing each other;
 a transmitting semiconductor laser mounted on the first principal surface and configured to emit light of a first wavelength;
 a receiving photodiode mounted on the predetermined axis and on the second principal surface and configured to receive light of a second wavelength;
 a communicating hole provided in a region of the mount substrate where the receiving photodiode is mounted, and letting the first and second principal surfaces communicate with each other;
 a first filter disposed on the predetermined axis and in a region intersecting with the first principal surface, and configured to reflect the light of the first wavelength and transmit the light of the second wavelength; and
 a lens for condensing the transmitting light and the receiving light, said lens being located on the predetermined axis so that the first filter is interposed between the receiving photodiode and the lens;
 wherein the mount substrate is covered by a resin body and the lens is buried in the resin body;
 wherein the light of the first wavelength having been emitted from the transmitting semiconductor laser and propagating along the first principal surface is reflected by the first filter, condensed by the lens and emitted as the transmitting light along the predetermined axis, and wherein the light of the second wavelength as the receiving light having propagated along the predetermined axis is condensed by the lens, transmitted by the first filter and travels through the communicating hole to be received by the receiving photodiode.

19. The optical transceiver module according to claim 18, further comprising a monitoring photodiode mounted on the first principal surface of the mount substrate so as to interpose the first filter between the transmitting semiconductor laser and the monitoring photodiode, and configured to receive light emitted from the transmitting semiconductor laser and transmitted by the first filter,
 wherein the monitoring photodiode is obliquely mounted on the first principal surface of the mount substrate so that the light receiving surface of the monitoring photodiode faces the first filter.

20. The optical transceiver module according to claim 18, wherein the receiving photodiode has a backside-illuminated type structure.

21. The optical transceiver module according to claim 20, wherein a second filter for shutting out the light of the first wavelength is provided between the receiving photodiode and the second principal surface of the mount substrate.

22. The optical transceiver module according to claim 20, wherein the receiving photodiode has a filter layer for absorbing the light of the first wavelength.

23. The optical transceiver module according to claim 18, comprising an amplifier mounted on the second principal surface and configured to amplify an electric signal from the receiving photodiode.

24. The optical transceiver module according to claim 18, wherein the mount substrate comprises:
 a first substrate including the first principal surface and a third principal surface facing the first principal surface; and a second substrate including the second principal surface and a fourth principal surface facing the second principal surface, wherein the mount substrate is formed by assembling the first and second substrates in a state in which the third and fourth principal surfaces face each other.

25. The optical transceiver module according to claim 18, comprising a fit portion provided on the first principal surface side of the mount substrate and configured to hold a ferrule with an optical fiber therein in a fit state.

26. An optical transceiver module for emitting transmitting light along a predetermined axis and receiving light having propagated along the predetermined axis, said optical transceiver module comprising:

a first mount substrate disposed so as to intersect with the predetermined axis and having first and second principal surfaces facing each other;

a transmitting semiconductor laser mounted on the first principal surface and configured to emit light of a first wavelength;

a communicating hole provided in a region where the predetermined axis intersects with the first mount substrate, and letting the first and second principal surfaces communicate with each other;

a second mount substrate disposed so as to intersect with the predetermined axis and having third and fourth principal surfaces facing each other;

a receiving photodiode mounted on the predetermined axis and on the third principal surface and configured to receive light of a second wavelength;

a first filter disposed on the predetermined axis and in a region intersecting with the first principal surface, and configured to reflect the light of the first wavelength and transmit the light of the second wavelength; and a lens for condensing the transmitting light and the receiving light, said lens being located on the predetermined axis so that the first filter is interposed between the receiving photodiode and the lens;

wherein the first mount substrate and the second mount substrate are assembled so that the second principal surface faces the third principal surface, a resin body is placed on the first principal surface of the first mount substrate and the lens is buried in the resin body, and the light of the first wavelength having been emitted from the transmitting semiconductor laser and propagating along the first principal surface is reflected by the first filter, condensed by the lens and emitted as the transmitting light along the predetermined axis, and wherein the light of the second wavelength as the receiving light having propagated along the predetermined axis is condensed by the lens, transmitted by the first filter and travels through the communicating hole to be received by the receiving photodiode.

27. The optical transceiver module according to claim 26, comprising a monitoring photodiode mounted on the first principal surface of the first mount substrate so as to interpose the transmitting semiconductor laser between the first filter and the monitoring photodiode, and configured to receive backward light from the transmitting semiconductor laser.

28. The optical transceiver module according to claim 26, comprising a monitoring photodiode mounted on the first principal surface of the first mount substrate so as to interpose the first filter between the transmitting semiconductor laser and the monitoring photodiode, and configured to receive light emitted from the transmitting semiconductor laser and transmitted by the first filter, wherein the monitoring photodiode is obliquely mounted on the first principal surface of the mount substrate so that a light receiving surface of the monitoring photodiode faces the first filter.

29. The optical transceiver module according to claim 26, wherein the receiving photodiode has a frontside illuminated type structure.

30. The optical transceiver module according to claim 26, wherein a second filter for shutting out the light of the first wavelength is provided on the second principal surface in the region where the communicating hole in the first mount substrate is provided.

31. The optical transceiver module according to claim 26, comprising an amplifier mounted on the third principal surface of the second mount substrate and configured to amplify an electric signal from the receiving photodiode.

32. The optical transceiver module according to claim 26, comprising a fit portion provided on the first principal surface side of the first mount substrate and configured to hold a ferrule with an optical fiber therein in a fit state.

* * * * *